(12) United States Patent
Aoyagi et al.

(10) Patent No.: US 9,425,433 B2
(45) Date of Patent: Aug. 23, 2016

(54) DISPLAY DEVICE AND ELECTRONIC DEVICE HAVING ANTI-REFLECTION MEMBER PROVIDED BETWEEN BLACK MATRIX AND SUBSTRATE

(71) Applicant: Sony Corporation, Tokyo (JP)

(72) Inventors: Kenichi Aoyagi, Kanagawa (JP); Nobutoshi Fujii, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/165,014

(22) Filed: Jan. 27, 2014

(65) Prior Publication Data

US 2014/0217431 A1    Aug. 7, 2014

(30) Foreign Application Priority Data

Feb. 5, 2013  (JP) .................................. 2013-020655

(51) Int. Cl.
  *H01L 51/52*  (2006.01)
  *G02B 1/118*  (2015.01)
  *H01L 27/32*  (2006.01)

(52) U.S. Cl.
  CPC ............ *H01L 51/5284* (2013.01); *G02B 1/118* (2013.01); *H01L 27/322* (2013.01); *H01L 51/524* (2013.01); *H01L 2251/5315* (2013.01)

(58) Field of Classification Search
  CPC ....... H01L 31/12; H01L 31/125; H01L 51/50; H01L 51/5012; H01L 51/5036; H01L 51/504; H01L 2227/32; H01L 27/32
  See application file for complete search history.

(56) References Cited

U.S. PATENT DOCUMENTS

| | | | | |
|---|---|---|---|---|
| 5,966,242 A | * | 10/1999 | Yamanaka | ................. 359/618 |
| 2006/0214579 A1 | * | 9/2006 | Iwase et al. | ................. 313/512 |
| 2012/0126688 A1 | * | 5/2012 | Richardson et al. | ......... 313/504 |
| 2014/0374704 A1 | * | 12/2014 | Jang et al. | ...................... 257/40 |

FOREIGN PATENT DOCUMENTS

| | | |
|---|---|---|
| JP | 2003-203762 | 7/2003 |
| JP | 2010-008861 | 1/2010 |
| JP | 2010-079240 | 4/2010 |
| JP | 2010-239003 | 10/2010 |
| JP | 2011-013387 | 1/2011 |

OTHER PUBLICATIONS

Japanese Office Action issued Mar. 8, 2016 in corresponding Japanese Application No. 2013-020655.

* cited by examiner

*Primary Examiner* — Mohammad Islam
*Assistant Examiner* — Mikka Liu
(74) *Attorney, Agent, or Firm* — K&L Gates LLP

(57) ABSTRACT

There is provided a display device including a plurality of light emitting elements over a first substrate, and an anti-reflection member configured to prevent reflection of light from a first substrate side at a boundary portion in a pixel region corresponding to each of the light emitting elements, the anti-reflection member being on a second substrate side where a second substrate faces the first substrate.

15 Claims, 18 Drawing Sheets

DISPLAY DEVICE AND ELECTRONIC DEVICE HAVING ANTI-REFLECTION MEMBER PROVIDED BETWEEN BLACK MATRIX AND SUBSTRATE

CROSS REFERENCES TO RELATED APPLICATIONS

The present application claims priority to Japanese Priority Patent Application JP 2013-020655 filed in the Japan Patent Office on Feb. 5, 2013, the entire content of which is hereby incorporated by reference.

BACKGROUND

The present disclosure relates to a display device, a method for manufacturing the display device, and an electronic device. The present disclosure particularly relates to a display device including light emitting elements.

In a top-emission type display device including light emitting elements using organic electroluminescence (EL), inorganic EL, or the like, for example, an element substrate over which the light emitting elements are provided and a sealing substrate that faces the element substrate are provided, and light emitted from the light emitting elements passes through the transparent sealing substrate to be observed. For example, in a case where the light emitting elements emit white light, light emitted from each of the light emitting elements passes through color filters provided for the sealing substrate to be observed as light having a color of each pixel. Further, in a case where the light emitting elements emit light having colors of the respective pixels, e.g., red, green, and blue, color filters can be used to improve color purity.

In order to improve contrast, the above-described sealing substrate (also referred to as color filter substrate), light shielding members called black matrixes are provided at positions corresponding to boundaries between each pixel regions. JP 2010-008861A, for example, discloses a technique regarding the black matrixes. According to the technique in JP 2010-008861A, in order to suppress diffraction of light that occurs at boundaries between transmissive regions of color filters and black matrix regions, the transmissive regions have gradation of optical density.

SUMMARY

A metal film of titanium or the like, which is commonly used for the black matrix, has a preferable light shielding property but has high reflectance of light. Accordingly, there have been cases where light emitted from a light emitting element is reflected by a surface of the black matrix to return to the element substrate side and is further reflected by wiring or interfaces between films, resulting in mixing of the light into a region of another pixel that is different from a pixel corresponding to the light emitting element.

Accordingly, according to the present disclosure, there are proposed a display device, a method for manufacturing the display device, and an electronic device that are novel and improved and can effectively prevent the reflection of the light emission at a boundary portions in a pixel region.

According to an embodiment of the present disclosure, there is provided a display device including a plurality of light emitting elements over a first substrate, and an anti-reflection member configured to prevent reflection of light from a first substrate side at a boundary portion in a pixel region corresponding to each of the light emitting elements, the anti-reflection member being on a second substrate side where a second substrate faces the first substrate.

According to another embodiment of the present disclosure, there is provided a method for manufacturing a display device, the method including providing an anti-reflection member on a second substrate side where a second substrate faces a first substrate, the anti-reflection member being configured to prevent reflection of light from a first substrate side at a boundary portion in a pixel region corresponding to each of a plurality of light emitting elements over the first substrate, and bonding the second substrate to the first substrate over which the plurality of light emitting elements are provided.

According to another embodiment of the present disclosure, there is provided an electronic device including a display device including a plurality of light emitting elements provided over a first substrate, and an anti-reflection member configured to prevent reflection of light from a first substrate side at a boundary portion in a pixel region corresponding to each of the light emitting elements, the anti-reflection member being on a second substrate side where a second substrate faces the first substrate.

By disposing the anti-reflection member at the boundary portion in the pixel region, the light emission at this portion is prevented from reflecting. Accordingly, it is possible to prevent mixing of the light emission into a region of another pixel.

As described above, according to one or more of embodiments of the present disclosure, it is possible to effectively prevent the reflection of the light emission at the boundary portion in the pixel region.

Additional features and advantages are described herein, and will be apparent from the following Detailed Description and the figures.

DETAILED DESCRIPTION

Figure 1:
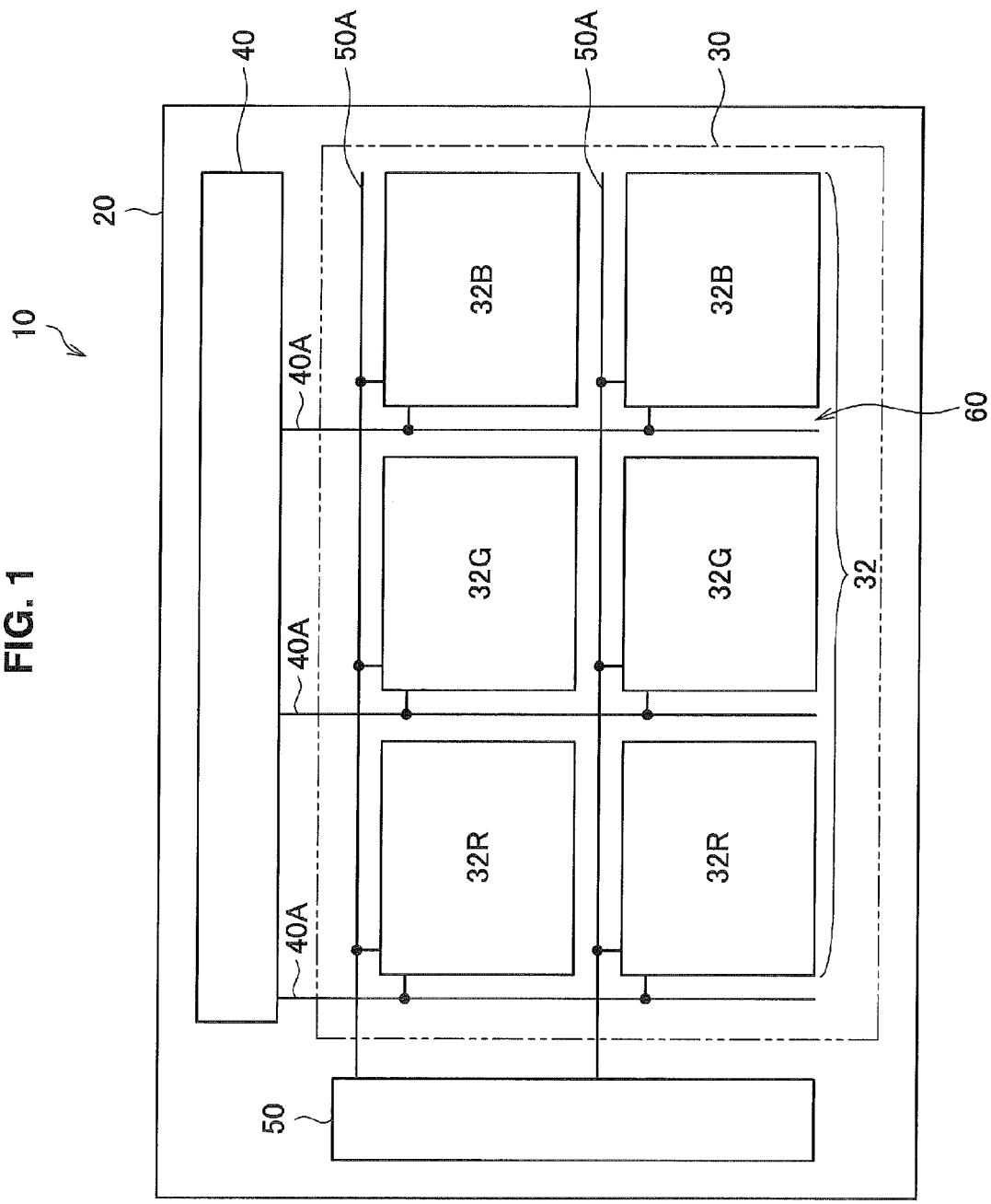
FIG. 1 illustrates an example of a structure of a display device according to a technique related to the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description will be made in the following order.
1. Description of Related Art
2. First Embodiment
2-1. Structure of Display Device
2-2. Method for Manufacturing Display Device
2-3. Application to Electronic Device
3. Second Embodiment
3-1. Structure of Display Device
3-2. Method for Manufacturing Display Device
4. Third Embodiment
4-1. Structure of Display Device
4-2. Method for Manufacturing Display Device
5. Fourth Embodiment
5-1. Structure of Display Device
5-2. Method for Manufacturing Display Device
6. Moth Eye Structure
7. Supplement 1. Description of Related Art For better understanding of embodiments of the present disclosure, first, a related technique will be described with reference to FIGS. 1 to 4.

(Overall Structure)

FIG. 1 illustrates an example of a structure of a display device according to a technique related to the present disclosure. The display device according to the technique related to the present disclosure is an organic EL display 10.

Referring to FIG. 1, the organic EL display 10 has a display region 30 over an element substrate 20, the display region 30 including red light emitting elements 32R, green light emitting elements 32G, and blue light emitting elements 32B arranged in matrix. A set of the red light emitting element 32R, the green light emitting element 32G, and the blue light emitting element 32B forms a pixel 32. On the periphery of the display region 30, a signal line driving circuit 40 and a scan line driving circuit 50 are provided as drivers to display images.

The display region 30 also includes a pixel driving circuit 60 that is connected to each of the red light emitting elements 32R, the green light emitting elements 32G, and the blue light emitting elements 32B. A configuration of the pixel driving circuit 60 will be further described below with reference to FIG. 2.

(Configuration of Pixel Driving Circuit)

Figure 2:
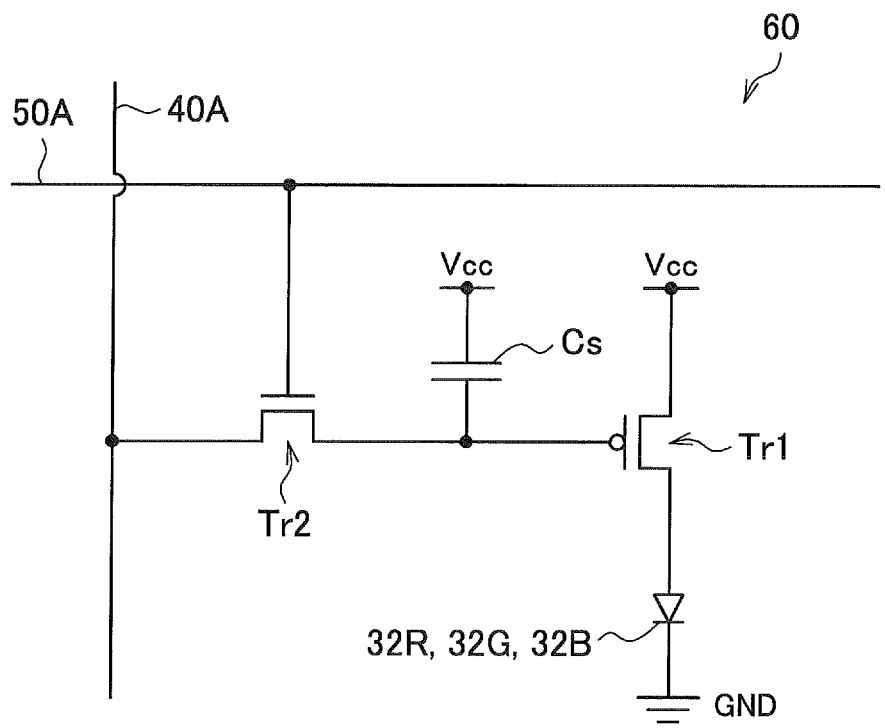
FIG. 2 illustrates an example of a configuration of a pixel driving circuit provided in an organic EL display.

FIG. 2 illustrates an example of a configuration of the pixel driving circuit 60 provided in the organic EL display 10. In this embodiment, the pixel driving circuit 60 is an active type driving circuit formed below a lower electrode of the light emitting elements described later.

Referring to FIG. 2, the pixel driving circuit 60 includes a driving transistor Tr1 and a writing transistor Tr2, and a capacitor Cs is connected between the driving transistor Tr1 and the writing transistor Tr2. The red light emitting element 32R, the green light emitting element 32G, or the blue light emitting element 32B is connected to the driving transistor Tr1 in series between a first power source line Vcc and a second power source line GND.

Here, each of the driving transistor Tr1 and the writing transistor Tr2 is a commonly used thin film transistor (TFT). Examples of a structure of the TFT include various structures such as an inverted staggered structure (bottom-gate type) and a staggered structure (top-gate type).

Further, in the pixel driving circuit 60, a plurality of column-direction signal lines 40A and a plurality of row-direction scan lines 50A are arranged. Each intersection between the signal line 40A and the scan line 50A corresponds to any of the red light emitting elements 32R, the green light emitting elements 32G, and the blue light emitting elements 32B. Each of the signal lines 40A is connected to the above-described signal line driving circuit 40, and the signal line driving circuit 40 supplies image signals to a source electrode of the writing transistor Tr2 through the signal line 40A. In a similar manner, each of the scan lines 50A is connected to the above-described scan line driving circuit 50, and the scan line driving circuit 50 sequentially supplies scan signals to a gate electrode of the writing transistor Tr2 through the scan line 50A.

(Structure of Display Region)

Figure 3:
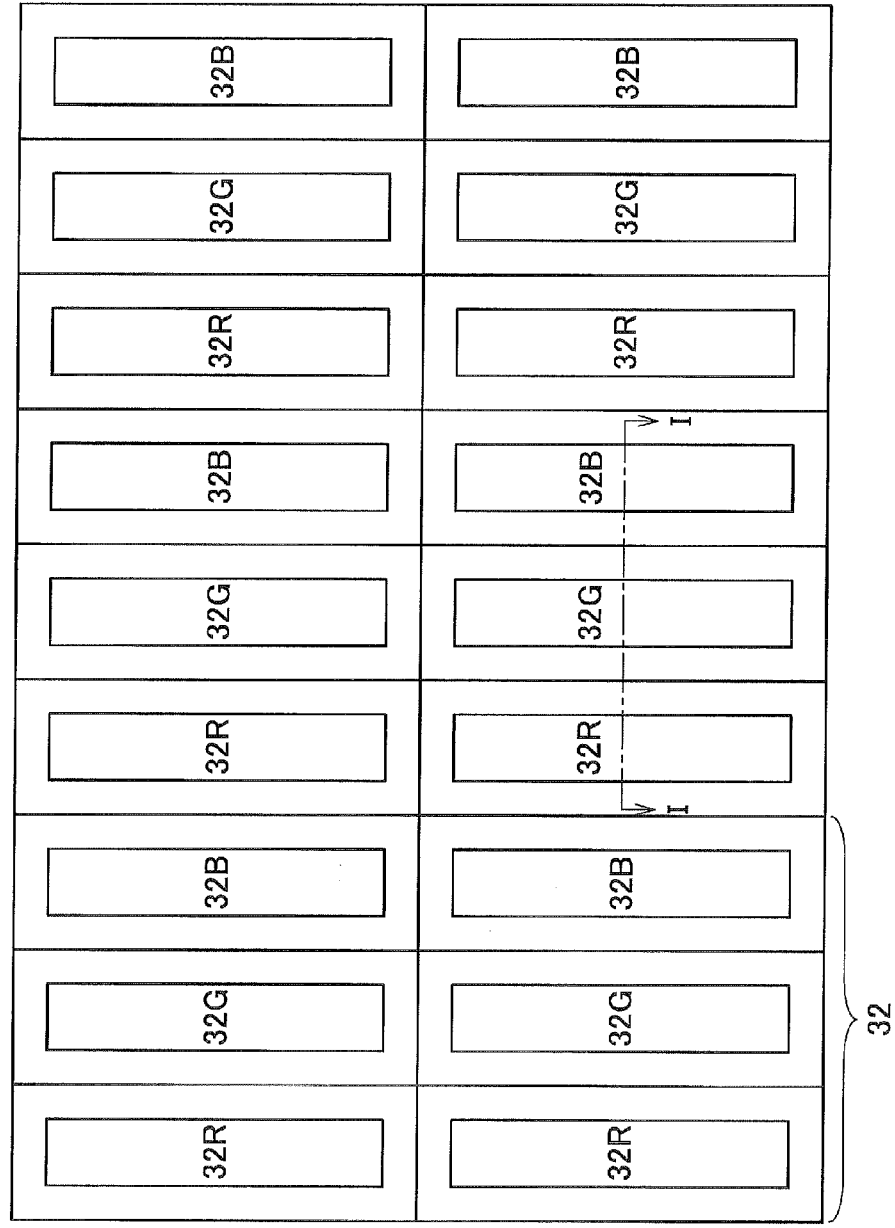
FIG. 3 illustrates an example of a plane structure of a display region in an organic EL display.
Figure 4:
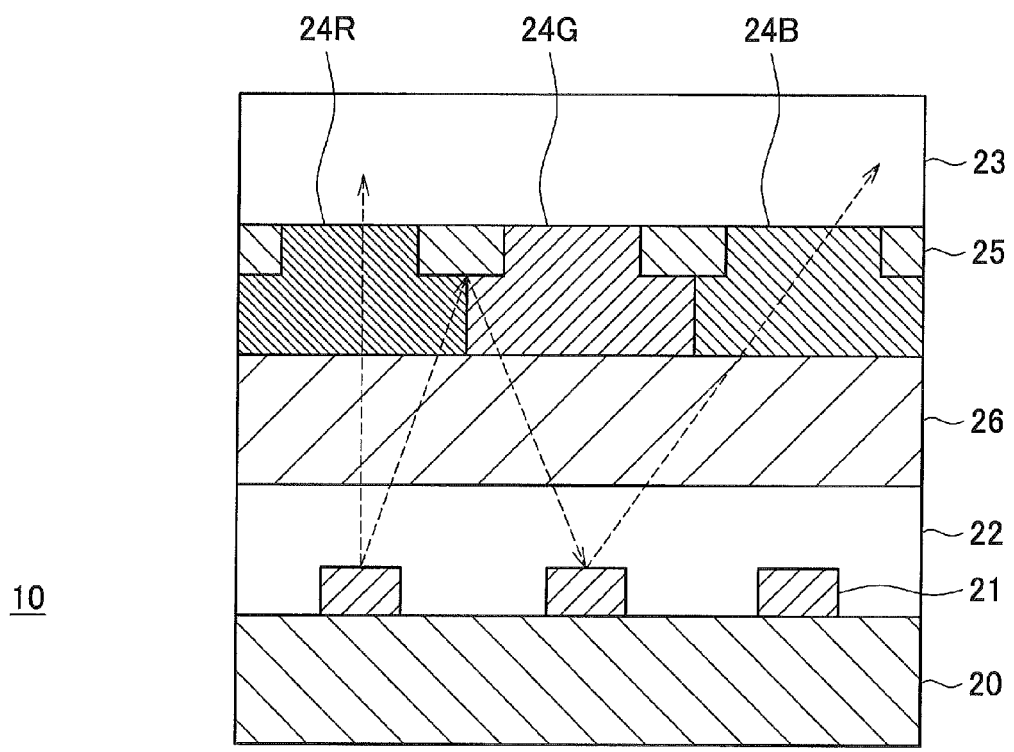
FIG. 4 illustrates an example of a cross-sectional structure of a display region taken along I-I in FIG. 3.

FIG. 3 illustrates an example of a plane structure of the display region 30 in the organic EL display 10. FIG. 4 illustrates an example of a cross-sectional structure of the display region 30 taken along I-I in FIG. 3. As illustrated in FIG. 3, in the display region 30, the red light emitting elements 32R, the green light emitting elements 32G, and the blue light emitting elements 32B are arranged in matrix. A set of the red light emitting element 32R, the green light emitting element 32G, and the blue light emitting element 32B forms the pixel 32.

As illustrated in FIG. 4, in the display region 30 in the organic EL display 10, the element substrate 20 and a sealing substrate 23 are bonded to each other with an adhesive layer 26 interposed therebetween. A plurality of light emitting elements 21 are provided over the element substrate 20, and the light emitting elements 21 are covered with a protective layer 22. Meanwhile, on the sealing substrate 23 side, color filters 24 (a red color filter 24R, a green color filter 24G, and a blue color filter 24B) are provided, and black matrixes 25 are provided at boundary portions between the color filters 24 having the respective colors. The adhesive layer 26 is positioned between the protective layer 22 and the color filters 24. Each structural element will be described below.

The element substrate 20 is a support having a planar surface. Examples of the element substrate 20 include meal foil, a resin film, a resin sheet, and the like. Since the organic EL display 10 is a top-emission type display device with which light from the light emitting elements is extracted from the sealing substrate 23 side, the element substrate 20 is not necessarily transparent. Although not shown, a TFT layer in which the pixel driving circuit 60 that is described above with reference to FIG. 2 is formed and a planarizing film for planarizing a surface of the TFT layer can be provided over the element substrate 20.

The light emitting elements 21 emit light of white, red, green, or blue, for example, by voltage application to a light emitting material having at least one peak wavelength in a predetermined wavelength range. Each of the light emitting elements 21 includes a light emitting material layer, and the lower electrode and an upper electrode for applying voltage to the light emitting material layer. The lower electrode is formed using an aluminum alloy for example, and is connected to the pixel driving circuit formed over the element substrate 20. The upper electrode is formed using a transparent electrode material for example, such as indium zinc oxide (IZO). One or more of a hole injection layer, a hole transport layer, an electron transport layer, an electron injection layer, and the like can be stacked above and below the light emitting material layer. Note that although FIG. 4 illustrates independent light emitting elements, layers other than the lower electrode and the light emitting material layer may be formed common to the light emitting elements.

The protective layer 22 is formed using an inorganic amorphous-based insulating material for example, and is formed to cover the light emitting elements 21 over the entire surface of the element substrate 20. The protective layer 22 has an insulating property or non-permeability for water for example, thereby protecting the light emitting elements 21. Note that the protective layer 22 is not necessarily provided and the adhesive layer 26 may be positioned on the light emitting elements 21 (upper electrode).

The sealing substrate 23 (transparent substrate) is formed of glass or the like, and seals a stack structure formed in the display region 30. Over the sealing substrate 23, in pixel regions corresponding to the respective light emitting elements 21, the color filters 24 (the red color filter 24R, the green color filter 24G, and the blue color filter 24B) having colors of the respective pixels are provided. Further, the black matrixes 25 are provided at boundary portions between the color filters having the respective colors.

Note that the boundary portions between the color filters 24 having the respective colors are shielded from light by the black matrixes 25, thereby contrast of images to be displayed is improved. Examples of the black matrixes 25 include a resin film containing a light shielding metal such as titanium, titanium nitride, tantalum, tantalum nitride, or tungsten, or a black pigment such as carbon. The black matrixes 25 have a smaller thickness than the color filters 24 as illustrated, or have a substantially equal thickness to the color filters 24.

The adhesive layer 26 is formed using a heat curable resin, an ultraviolet ray curable resin, or the like, and adheres the element substrate 20 and the sealing substrate 23 to each other by being interposed therebetween.

In the above-described organic EL display 10, part of light emitted from the light emitting elements 21 might be reflected by surfaces of the black matrixes 25 formed using a metal film or the like to return to the element substrate 20 side, and might be further reflected by wiring or interfaces between films over the element substrate 20, resulting in mixing of the light into a pixel region that is different from a pixel region that is supposed to correspond to the light emitting element 21. Accordingly, contrast of images to be displayed might be decreased.

In order to prevent this, for example, the black matrixes 25 can be formed using a material having low reflectance. Although a metal film having low reflectance can be formed of chromium or chromium oxide, these uses have been difficult in recent years because adverse effects on environment are caused through manufacturing steps thereof. As for other metals, there has not found a material that can be used for a metal film to form the black matrixes 25, the material having sufficient light shielding property, sufficiently low reflectance, and sufficient corrosion resistance. Alternatively, the black matrixes 25 may be formed using a resin film having lower reflectance than a metal film; in that case, however, sufficiently low reflectance has not been obtained either.

Accordingly, in one or more embodiments of the present disclosure described below, structures are proposed that make it possible to prevent the light emission from reflecting at boundary portions in pixel regions regardless of a material for the black matrixes 25. Note that in the embodiments described below, since it is possible to make the same overall structure, the same structure of the pixel driving circuit, and the same plane structure of the display region as the above-described related art, a detailed description thereof will be omitted. Further, a detailed description of the same portions in a cross-sectional structure of the display region as the above-described related art might be omitted by denoting the same portions with the same reference numerals.

2. First Embodiment

First, a first embodiment of the present disclosure will be described.

(2-1. Structure of Display Device)

Figure 5:
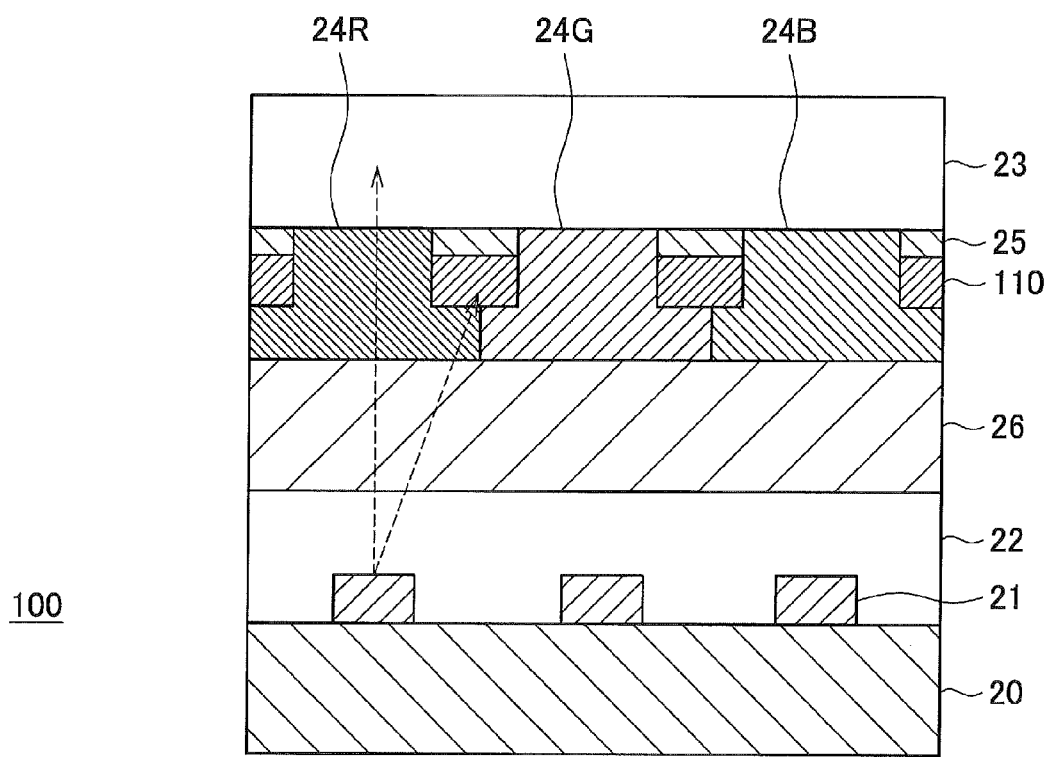
FIG. 5 illustrates an example of a cross-sectional structure of a display region in a display device according to a first embodiment of the present disclosure.

FIG. 5 illustrates an example of a cross-sectional structure of a display region in a display device according to the first embodiment of the present disclosure. The display device according to this embodiment is an organic EL display 100.

In a display region in the organic EL display 100, the element substrate 20 and the sealing substrate 23 are bonded to each other with the adhesive layer 26 interposed therebetween. The plurality of light emitting elements 21 are provided over the element substrate 20, and the light emitting elements 21 are covered with the protective layer 22. Meanwhile, on the sealing substrate 23 side, the color filters 24 (the red color filter 24R, the green color filter 24G, and the blue color filter 24B) are provided.

Further, at boundary portions between the color filters 24 having the respective colors, between the color filters 24 and the sealing substrate 23, anti-reflection films 110 are provided together with the black matrixes 25. The black matrixes 25 are, as described above, light shielding members formed using a metal film or a resin film. The anti-reflection films 110 are provided along surfaces of the black matrixes 25 on the element substrate 20 side, and are members that prevent reflection of light from the element substrate 20 side, i.e., light emitted from the light emitting elements 21 (anti-reflection members).

The anti-reflection films 110 can be, for example, formed using a film of a metal, a resin, or an inorganic material, having a moth eye structure formed on a surface thereof. Note that the moth eye structure is a structure in which concaves and convexes are formed by micro protrusions at intervals that are shorter than the wavelength of light. On a surface of the film having the moth eye structure, since interfaces where refractive indexes are radically changed are not formed, it is possible to prevent incident light from reflecting. As will be described later, the moth eye structure of the anti-reflection films 110 is formed by a dry etching method or a nano-imprinting method, for example. Further, when employing the nano-imprinting method, the shape can be formed by curing with heat or an ultraviolet ray. When curing with heat, the anti-reflection films 110 are formed using a cyclo olefin polymer (COP), for example. Alternatively, when curing with the ultraviolet ray, the anti-reflection films 110 are formed using an acrylic-based or epoxy-based ultraviolet ray curable resin, for example. When employing the dry etching method, a given material capable of micromachining can be used for the anti-reflection films 110; for example, silicon dioxide or a metal material such as aluminum may be used.

Alternatively, the anti-reflection films 110 may be formed by anti-reflection coating (ARC). The thickness of the anti-reflection coating is set such that the phase of light from the light emitting elements, the light being reflected by a surface of the anti-reflection coating, is opposite to the phase of the light reflected by the interface between the anti-reflection coating and the black matrixes 25. Accordingly, interference of light reflected by the surface or the interface can occur, resulting in preventing the incident light from reflecting. In a case where the anti-reflection coating is made of a single layer, the anti-reflection films 110 are formed using a material having a refractive index that is about the middle between the refractive index of a material for the substrate and the refractive index of the air. In a case where the anti-reflection coating is made of multiple layers, the anti-reflection films 110 can be formed by stacking a layer of a low refractive index material (e.g., silicon dioxide) and a layer of a high refractive index material (e.g., titanium dioxide).

In this manner, the anti-reflection films 110 provided along the surfaces of the black matrixes 25 on the element substrate 20 side prevent further reflection of the light emitted from the light emitting elements 21 when the light reaches the vicinity of the surfaces of the black matrixes 25. Therefore, in the organic EL display 100, the emitted light is prevented from mixing into a pixel region that is different from a pixel region that is supposed to correspond to the light emitting element 21.

Note that there is a wavelength, i.e., anti-reflection target wavelength (hereinafter also simply referred to as target wavelength), that can be most effectively prevented from reflecting with an anti-reflection structure included in the anti-reflection films 110. In this embodiment, since the light emitted from the light emitting elements 21 is transmitted through the color filters 24 and then reaches the anti-reflection films 110, it is desirable that the target wavelength with the anti-reflection films 110 is set according to the wavelength of light that is transmitted through the color filters 24 disposed in pixel regions on both sides. More specifically, the target wavelength with the anti-reflection films 110 may be set based on the wavelength that is the longer of the two wavelengths of light that is transmitted through the color filters 24 disposed in pixel regions on both sides. For example, the target wavelength with the anti-reflection film 110 that is disposed between the color filter 24R (the color of light transmitting therethrough is red) and the color filter 24 G (the color of light transmitting therethrough is green) can be set based on the longer of the two wavelengths of light transmitting therethrough, that is, the wavelength of red transmitting light.

To set the target wavelength with the anti-reflection films 110, in a case of a moth eye structure for example, specifically, the target wavelength can be set by adjusting the intervals between the micro protrusions. The longer the intervals between the micro protrusions, the longer the target wavelength becomes. Meanwhile, in a case of the anti-reflection coating for example, the target wavelength can be set by adjusting the thickness thereof.

(2-2. Method for Manufacturing Display Device)

Figure 6:
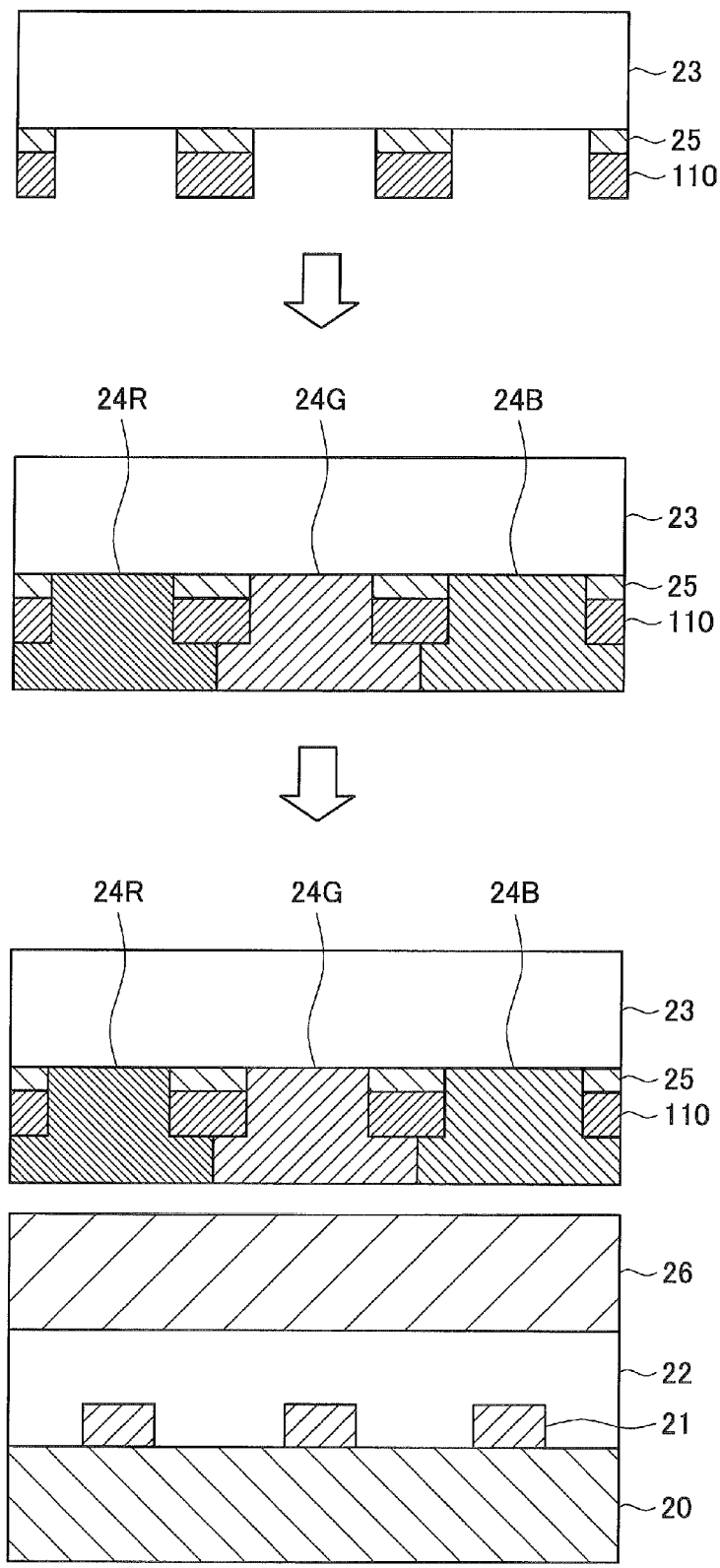
FIG. 6 illustrates states of a display device in steps of a method for manufacturing the display device according to the first embodiment of the present disclosure.

FIG. 6 illustrates states of the display device in steps of a method for manufacturing the display device according to the first embodiment of the present disclosure. Referring to FIG. 6, first, the black matrixes 25 and the anti-reflection films 110 are formed over the sealing substrate 23. The black matrixes 25 and the anti-reflection films 110 can be formed by, for example, applying a material for the black matrixes 25 first over the sealing substrate 23, applying a material for the anti-reflection films 110 thereover, and then patterning the materials using photolithography.

Here, in a case where the anti-reflection films 110 are formed using a film of a metal, a resin, an inorganic material, or the like, having a moth eye structure formed on a surface thereof, the moth eye structure is formed on surfaces of the anti-reflection films 110 by a dry etching method, a nano-imprinting method, or the like, for example. The moth eye structure may be formed before patterning of the anti-reflection films 110 into the illustrated shapes, or may be formed after patterning of the anti-reflection films 110.

Next, the color filters 24 having the respective colors are formed. The color filters 24 may be formed by, for example, patterning using photolithography or an inkjet method. In the illustrated example, since the black matrixes 25 and the anti-reflection films 110 each have a smaller thickness than the color filters 24, the color filters 24 are formed to cover these members.

Meanwhile, the light emitting elements 21 and the protective layer 22 are formed over the element substrate 20 in a different process, and the two substrates (including the members formed thereover) are bonded to each other with the adhesive layer 26 interposed therebetween. After that, by curing the adhesive layer 26, the organic EL display 100 is completed. Note that although the adhesive layer 26 is applied on the element substrate 20 side in the illustrated example, the adhesive layer 26 may be applied on the sealing substrate 23 side.

(2-3. Application to Electronic Device)

Figure 7:
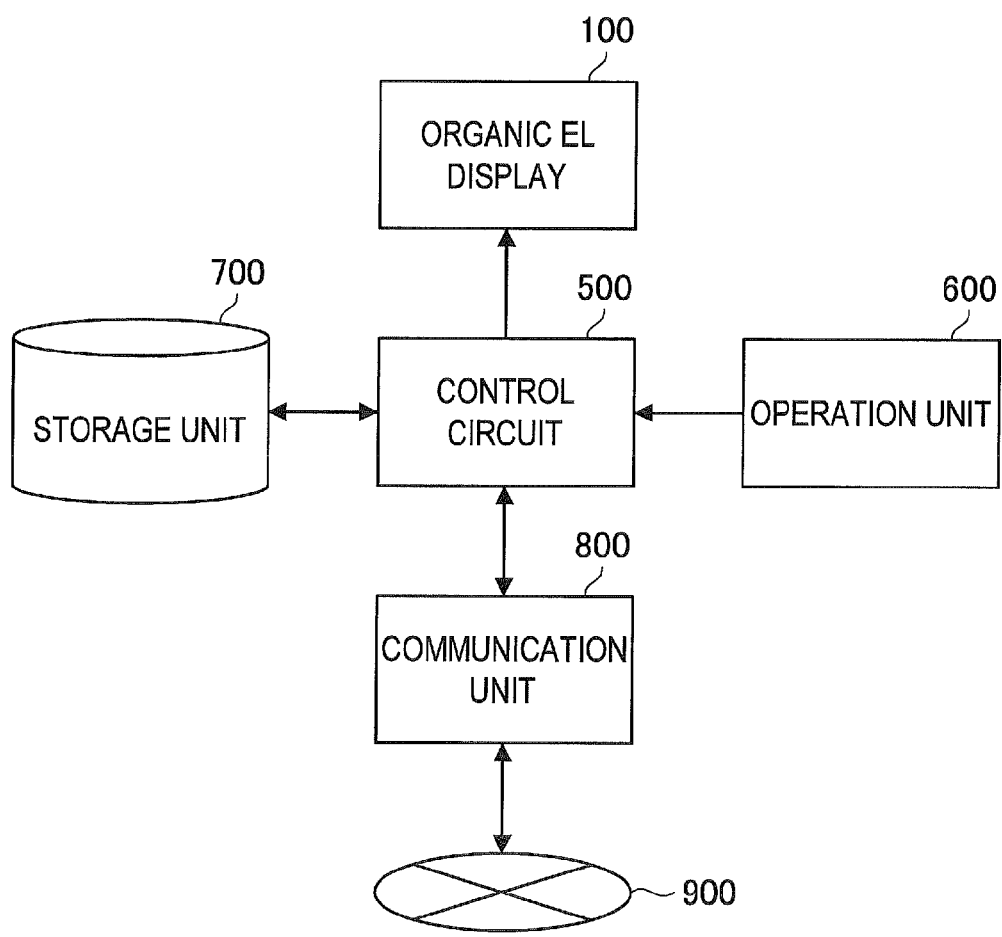
FIG. 7 is a schematic block diagram showing a configuration of an electronic device according to the first embodiment of the present disclosure.

Next, a configuration of an electronic device including the display device according to the first embodiment of the present disclosure will be described with reference to FIG. 7. FIG. 7 is a schematic block diagram showing the configuration of the electronic device according to the first embodiment of the present disclosure.

Referring to FIG. 7, an electronic device 1000 includes the organic EL display 100, a control circuit 500, an operation unit 600, a storage unit 700, and a communication unit 800. The electronic device 1000 is a certain device including the organic EL display 100 as a display unit, such as a television, a cell phone (smart phone), a digital camera, or a personal computer.

The control circuit 500 is configured with a central processing unit (CPU), random access memory (RAM), read only memory (ROM), or the like for example, and controls each unit in the electronic device 1000. The organic EL display 100 is also controlled by this control circuit 500.

The operation unit 600 is configured with a touch pad, a button, a key board, a mouse, and the like for example, and receives operation inputs by a user to the electronic device

1000. The control circuit 500 controls the electronic device 1000 in accordance with the operation inputs acquired by the operation unit 600.

The storage unit 700 is configured with semiconductor memory, a magnetic disk, an optical disk, or the like for example, and stores various data that are used so that the electronic device 1000 can function. The control circuit 500 may be operated by reading and executing a program stored in the storage unit 700.

The communication unit 800 is provided additionally. The communication unit 800 is a communication interface that is connected to a wired or wireless network 900, and is configured with a modem, a port, an antenna, and the like for example. The control circuit 500 receives data from the network 900 and transmits data to the network 900, both through the communication unit 800.

An embodiment of the present disclosure includes not only the above-described organic EL display 100 but also the electronic device 1000 including the organic EL display 100.

3. Second Embodiment

Next, a second embodiment of the present disclosure will be described. Note that the second embodiment can be applied to an electronic device in the same manner as the first embodiment, and therefore a repeated description thereof is omitted.

(3-1. Structure of Display Device)

Figure 8:
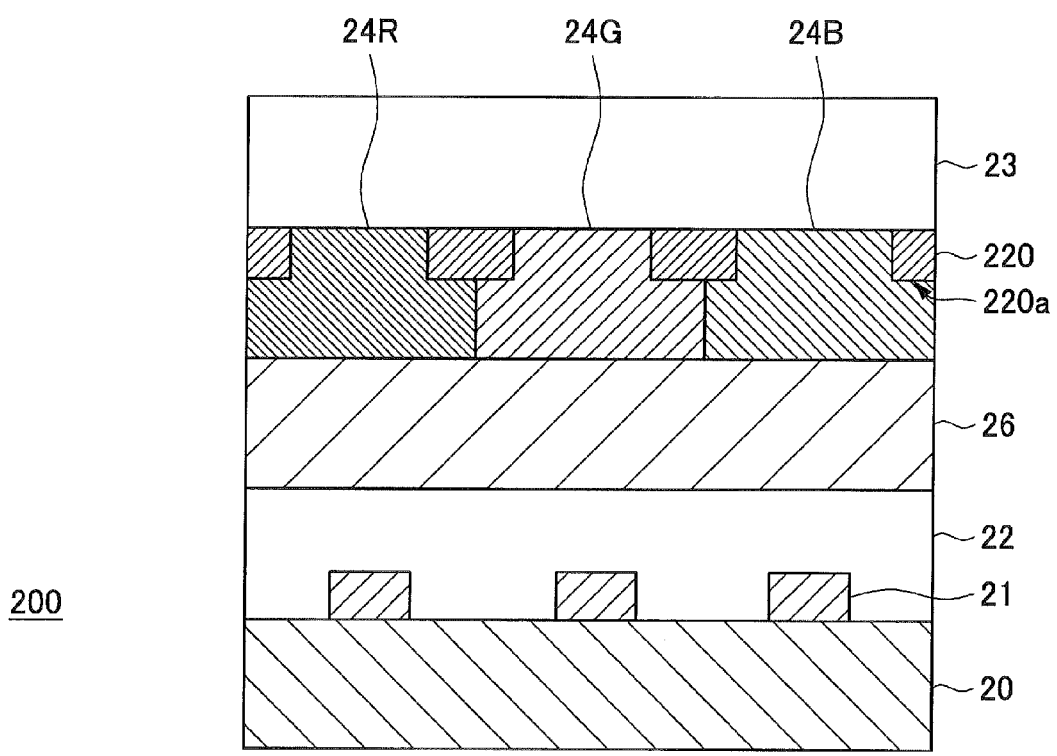
FIG. 8 illustrates an example of a cross-sectional structure of a display region in a display device according to a second embodiment of the present disclosure.

FIG. 8 illustrates an example of a cross-sectional structure of a display region in a display device according to the second embodiment of the present disclosure. The display device according to this embodiment is an organic EL display 200.

In a display region in the organic EL display 200, the element substrate 20 and the sealing substrate 23 are bonded to each other with the adhesive layer 26 interposed therebetween. The plurality of light emitting elements 21 are provided over the element substrate 20, and the light emitting elements 21 are covered with the protective layer 22. Meanwhile, on the sealing substrate 23 side, the color filters 24 (the red color filter 24R, the green color filter 24G, and the blue color filter 24B) are provided.

Further, at boundary portions between the color filters 24 having the respective colors, between the color filters 24 and the sealing substrate 23, black matrixes 220 are provided. The black matrixes 220 are, in the same manner as the other black matrixes described above, light shielding members formed using a metal film or a resin film. The black matrixes 220 are different from the other black matrixes in that anti-reflation structures 220a are formed by processing surfaces of the black matrixes 220 on the element substrate 20 side. The anti-reflection structures 220a have a moth eye structure for example, and prevent reflection of light from the element substrate 20 side, i.e., light emitted from the light emitting elements 21. That is, in this embodiment, the formation of the anti-reflection structures 220a enables the black matrixes 220 to function also as anti-reflection members.

In this manner, in this embodiment, the anti-reflection structures 220a formed by processing surfaces of the black matrixes 220 on the element substrate 20 side prevent further reflection of part of the light emitted from the light emitting elements 21 when the light reaches the surfaces of the black matrixes 220. Therefore, in the organic EL display 200, the emitted light is prevented from mixing into a pixel region that is different from a pixel region that is supposed to correspond to the light emitting element 21.

Note that the anti-reflection target wavelength with the anti-reflection structures 220a can be set in the same manner as the target wavelength with the above-described anti-reflection films 110 in the first embodiment, and therefore a repeated description thereof is omitted.

Here, as a comparison between the above-described first embodiment and this embodiment, the structure of the display device in this embodiment can be simpler because the anti-reflection structures 220a are provided on the surfaces of the black matrixes 220 and other anti-reflection members are not necessarily provided. In contrast, in the first embodiment, the anti-reflection films 110 are expected to be provided as members other than the black matrixes 25, and the structure of the display device is more complex than that in this embodiment. In the first embodiment, however, since the black matrixes 25 and the anti-reflection films 110 are separate members, optical materials for the respective members can be selected. For example, by selecting a material having a high light shielding property for the black matrixes 25, it is possible to reduce the thickness thereof. In addition, in a case of the moth eye structure for example, by selecting a material that can be easily processed by a dry etching method or a nano-imprinting method for the anti-reflection films, it is possible to form an extremely precise moth eye structure.

(3-2. Method for Manufacturing Display Device)

Figure 9:
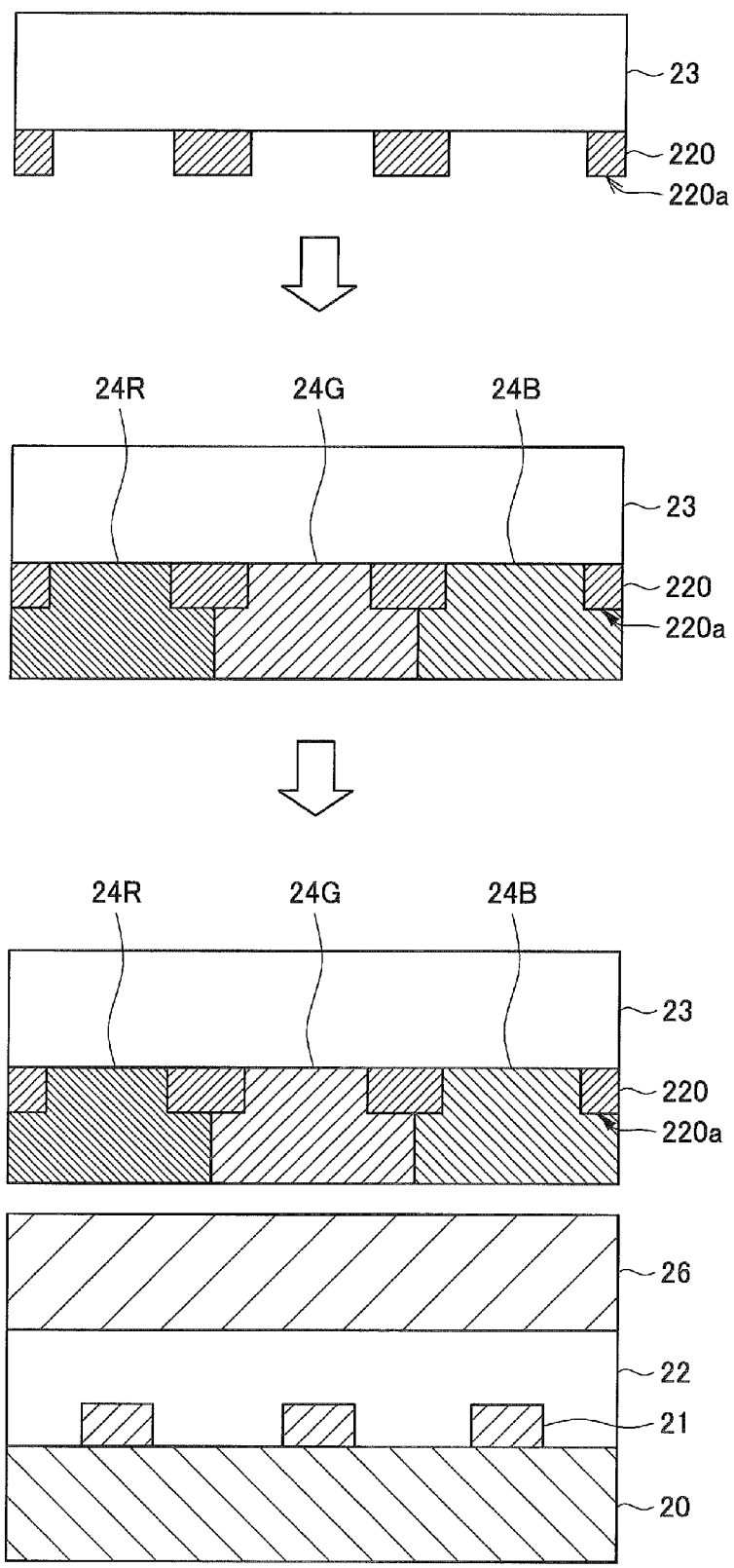
FIG. 9 illustrates states of a display device in steps of a method for manufacturing the display device according to the second embodiment of the present disclosure.

FIG. 9 illustrates states of the display device in steps of a method for manufacturing the display device according to the second embodiment of the present disclosure. Referring to FIG. 9, first, the black matrixes 220 are formed over the sealing substrate 23, and the surfaces of the black matrixes 220 are processed to form the anti-reflection structures 220a. The black matrixes 220 can be formed by, for example, applying a material over the sealing substrate 23, and patterning the material using photolithography. In a case of the moth eye structure for example, the anti-reflection structures 220a are formed by processing the surfaces of the black matrixes 220 by a dry etching method, a nano-imprinting method, or the like. The anti-reflection structures 220a may be formed before patterning of the black matrixes 220 into the illustrated shapes, or may be formed after patterning of the black matrixes 220.

Next, the color filters 24 having the respective colors are formed. The color filters 24 may be formed by, for example, patterning using photolithography or an inkjet method. In the illustrated example, since the black matrixes 220 have a smaller thickness than the color filters 24, the color filters 24 are formed to cover the black matrixes 220.

Meanwhile, the light emitting elements 21 and the protective layer 22 are formed over the element substrate 20 in a different process, and the two substrates (including the members formed thereover) are bonded to each other with the adhesive layer 26 interposed therebetween. After that, by curing the adhesive layer 26, the organic EL display 200 is completed. Note that although the adhesive layer 26 is applied on the element substrate 20 side in the illustrated example, the adhesive layer 26 may be applied on the sealing substrate 23 side.

4. Third Embodiment

Next, a third embodiment of the present disclosure will be described. Note that the third embodiment can be applied to an electronic device in the same manner as the first embodiment, and therefore a repeated description thereof is omitted.

(4-1. Structure of Display Device)

Figure 10:
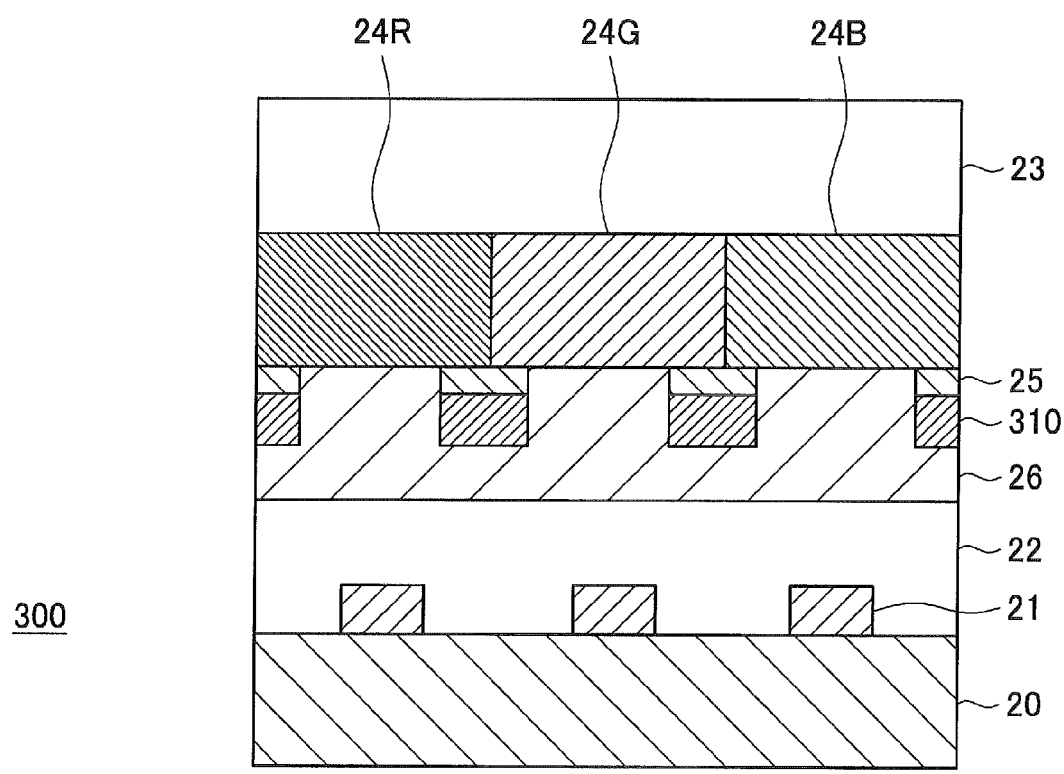
FIG. 10 illustrates an example of a cross-sectional structure of a display region in a display device according to a third embodiment of the present disclosure.

FIG. 10 illustrates an example of a cross-sectional structure of a display region in a display device according to the third embodiment of the present disclosure. The display device according to this embodiment is an organic EL display 300.

In a display region in the organic EL display 300, the element substrate 20 and the sealing substrate 23 are bonded to each other with the adhesive layer 26 interposed therebetween. The plurality of light emitting elements 21 are provided over the element substrate 20, and the light emitting elements 21 are covered with the protective layer 22. Meanwhile, on the sealing substrate 23 side, the color filters 24 (the red color filter 24R, the green color filter 24G, and the blue color filter 24B) are provided.

Further, at boundary portions between the color filters 24 having the respective colors, anti-reflection films 310 are provided together with the black matrixes 25 over surfaces of the color filters 24 on the element substrate 20 side. The black matrixes 25 are, as described above, light shielding members formed using a metal film or a resin film. The anti-reflection films 310 are provided along the surfaces of the black matrixes 25 on the element substrate 20 side, and prevent light from the element substrate 20 side, i.e., light emitted from the light emitting elements 21, from being reflected by these surfaces.

The anti-reflection films 310 may be, in the same manner as the above described anti-reflection films 110 according to the first embodiment, for example, formed using a film of a metal, a resin, or an inorganic material, having a moth eye structure formed on a surface thereof, or may be formed by anti-reflection coating (ARC). In this embodiment, the anti-reflection films 310 provided along the surfaces of the black matrixes 25 on the element substrate 20 side prevent further reflection of the light emitted from the light emitting elements 21 when the light reaches the vicinity of the surfaces of the black matrixes 25. Therefore, in the organic EL display 300, the emitted light is prevented from mixing into a pixel region that is different from a pixel region that is supposed to correspond to the light emitting element 21.

Here, as a comparison between the above described first embodiment and this embodiment, the black matrixes 25 and the anti-reflection films 110 are provided between the color filters 24 and the sealing substrate 23 in the first embodiment. Therefore, a target of anti-reflection with the anti-reflection films 110 is light that has been transmitted through the color filters 24. Accordingly, in the first embodiment, the anti-reflection target wavelength with the anti-reflection films 110 can be set according to the wavelength of light transmitted through the color filters disposed in pixel regions on both sides.

Meanwhile, in this embodiment, the black matrixes 25 and the anti-reflection films 310 are provided over the surfaces of the color filters 24 on the element substrate 20 side. Therefore, the target of anti-reflection with the anti-reflection films 310 is light emitted from the light emitting elements 21 before entering the color filters 24. Accordingly, in this embodiment, the anti-reflection target wavelength with the anti-reflection films 310 can be set according to the wavelength of light emitted from the light emitting elements 21 disposed in pixel regions on both sides.

As described above, the light emitting elements 21 might emit light having colors of the respective pixels, such as red, green, and blue, or might emit white light that is a color common to the pixels. In the former case, since the emission wavelengths from the light emitting elements 21 differ depending on pixels, the anti-reflection target wavelength with the anti-reflection films 310 can be set according to the wavelength that is the longer of two emission wavelengths from the light emitting elements 21 disposed in pixel regions on both sides for example. In the latter case, since the emission wavelength from the light emitting elements 21 is common to the pixels, the anti-reflection wavelength with the anti-reflection films 310 can be common to the pixels. Accordingly, according to this embodiment, it is possible to set the target wavelength with the anti-reflection films 310 common to the pixels when the light emitting elements 21 emit white light, and therefore there is an advantage that a step for forming the anti-reflection films 310 is simplified.

(4-2. Method for Manufacturing Display Device)

Figure 11:
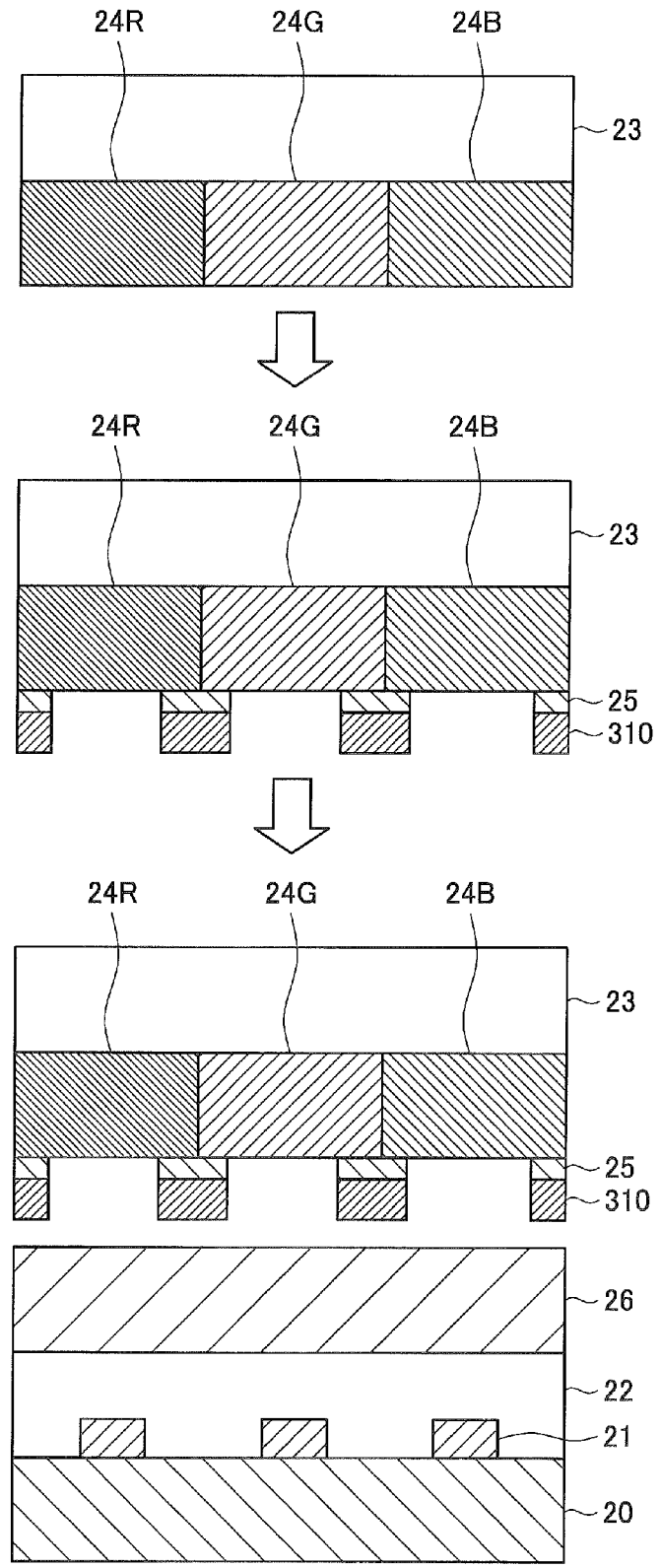
FIG. 11 illustrates states of a display device in steps of a method for manufacturing the display device according to the third embodiment of the present disclosure.

FIG. 11 illustrates states of the display device in steps of a method for manufacturing the display device according to the third embodiment of the present disclosure. Referring to FIG. 11, first, the color filters 24 having the respective colors are formed over the sealing substrate 23. The color filters 24 may be formed by, for example, patterning using photolithography or an inkjet method.

Next, the black matrixes 25 and the anti-reflection films 310 are formed over the color filters 24. The black matrixes 25 and the anti-reflection films 310 can be formed by, for example, first applying a material for the black matrixes 25 over the color filters 24 or a protective layer that will be described later, applying a material for the anti-reflection films 310 thereover, and then patterning the materials using photolithography.

At this time, in a case where there is concern for damage to the color filters 24 through the step for forming the black matrixes 25 and the anti-reflection films 310, the protective layer that is not illustrated may be formed over the surfaces of the color filters 24, and then the black matrixes 25 and the anti-reflection films 310 may be formed thereover. Further, the color filters 24 having the respective colors might be formed with different thicknesses because of spectral characteristics, and a step can also be generated at boundary portions through the formation step. Also in a case where the step at boundary portions between the color filters 24 is large, the protective layer that is not illustrated may be formed over the surfaces of the color filters 24 and a surface of the protective layer is smoothed by chemical mechanical polishing (CMP) for example, and then the black matrixes 25 and the anti-reflection films 310 may be formed. Alternatively, at a time when the material for the black matrixes 25 is applied over the surfaces having the step, the surfaces may be smoothed by CMP for example.

Here, in a case where the anti-reflection films 310 are formed using a film of a metal, a resin, an inorganic material, or the like, having a moth eye structure formed on surfaces thereof, the moth eye structure is formed on surfaces of the anti-reflection films 310 by a dry etching method, a nano-imprinting method, or the like, for example. The moth eye structure may be formed before patterning of the anti-reflection films 310 into the illustrated shapes, or may be formed after patterning of the anti-reflection films 310.

Meanwhile, the light emitting elements 21 and the protective layer 22 are formed over the element substrate 20 in a different process, and the two substrates (including the members formed thereover) are bonded to each other with the adhesive layer 26 interposed therebetween. After that, by curing the adhesive layer 26, the organic EL display 300 is completed. Note that although the adhesive layer 26 is applied on the element substrate 20 side in the illustrated example, the adhesive layer 26 may be applied on the sealing substrate 23 side.

5. Fourth Embodiment

Next, a fourth embodiment of the present disclosure will be described. Note that the fourth embodiment can be applied to an electronic device in the same manner as the first embodiment, and therefore a repeated description thereof is omitted.

(5-1. Structure of Display Device)

Figure 12:
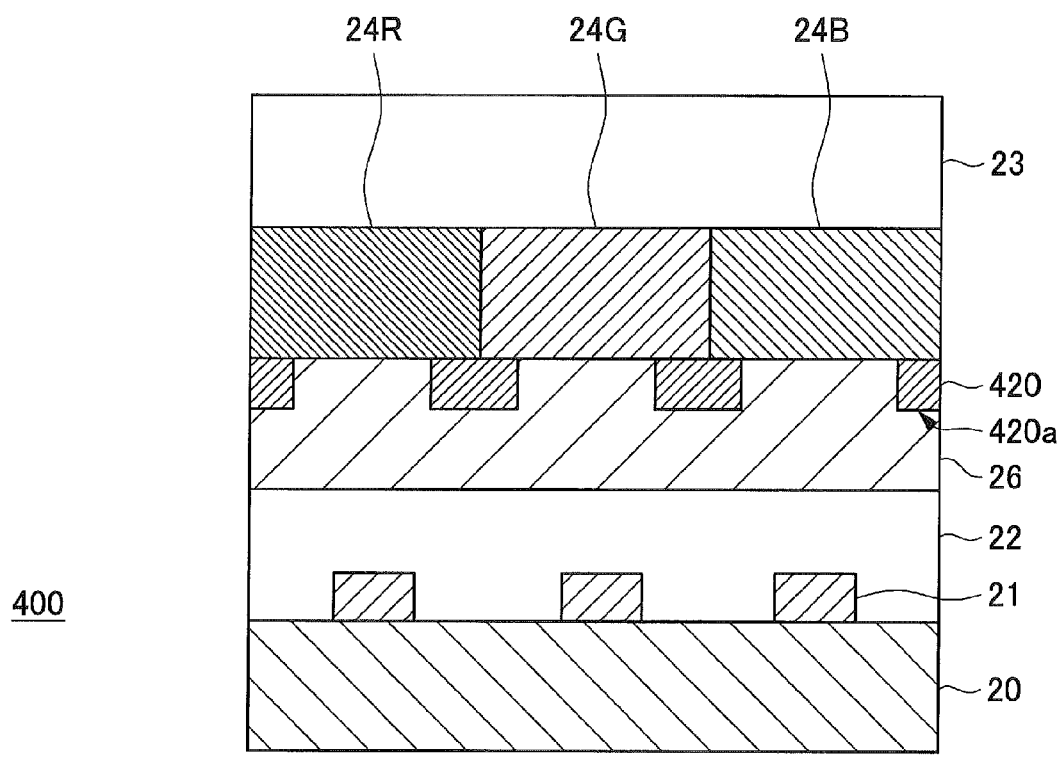
FIG. 12 illustrates an example of a cross-sectional structure of a display region in a display device according to a fourth embodiment of the present disclosure.

FIG. 12 illustrates an example of a cross-sectional structure of a display region in a display device according to the fourth embodiment of the present disclosure. The display device according to this embodiment is an organic EL display 400.

In a display region in the organic EL display 400, the element substrate 20 and the sealing substrate 23 are bonded to each other with the adhesive layer 26 interposed therebetween. The plurality of light emitting elements 21 are provided over the element substrate 20, and the light emitting elements 21 are covered with the protective layer 22. Meanwhile, on the sealing substrate 23 side, the color filters 24 (the red color filter 24R, the green color filter 24G, and the blue color filter 24B) are provided.

Further, at boundary portions between the color filters 24 having the respective colors, black matrixes 420 are provided over the surfaces of the color filters 24 on the element substrate 20 side. The black matrixes 420 are, in the same manner as the other black matrixes described above, light shielding members formed using a metal film or a resin film. The black matrixes 420 are different from the other black matrixes in that anti-reflation structures 420a are formed by processing surfaces of the black matrixes 420 on the element substrate 20 side. The anti-reflection structures 420a have a moth eye structure for example, and prevent reflection of light from the element substrate 20 side, i.e., light emitted from the light emitting elements 21. That is, in this embodiment, the formation of the anti-reflection structures 420a enables the black matrixes 420 to function also as anti-reflection members.

In this manner, in this embodiment, the anti-reflection structures 220a formed by processing surfaces of the black matrixes 420 on the element substrate 20 side prevent further reflection of part of the light emitted from the light emitting elements 21 when the light reaches the surfaces of the black matrixes 420. Therefore, in the organic EL display 400, the emitted light is prevented from mixing into a pixel region that is different from a pixel region that is supposed to correspond to the light emitting element 21.

Note that the anti-reflection target wavelength with the anti-reflection structure 420a can be set in the same manner as the target wavelength with the above-described anti-reflection films 310 in the third embodiment, and therefore a repeated description thereof is omitted.

As is clear from the drawings, this embodiment is the same as the above-described second embodiment in that the anti-reflection structures 420a are formed by processing the surfaces of the black matrixes 420 and also is the same as the above-described third embodiment in that the anti-reflection structures 420a are formed over the surfaces of the color filters 24 on the element substrate 20 side. Accordingly, when the above-described first embodiment is compared with this embodiment for example, features of this embodiment can include both features of the second embodiment and the third embodiment.

(5-2. Method for Manufacturing Display Device)

Figure 13:
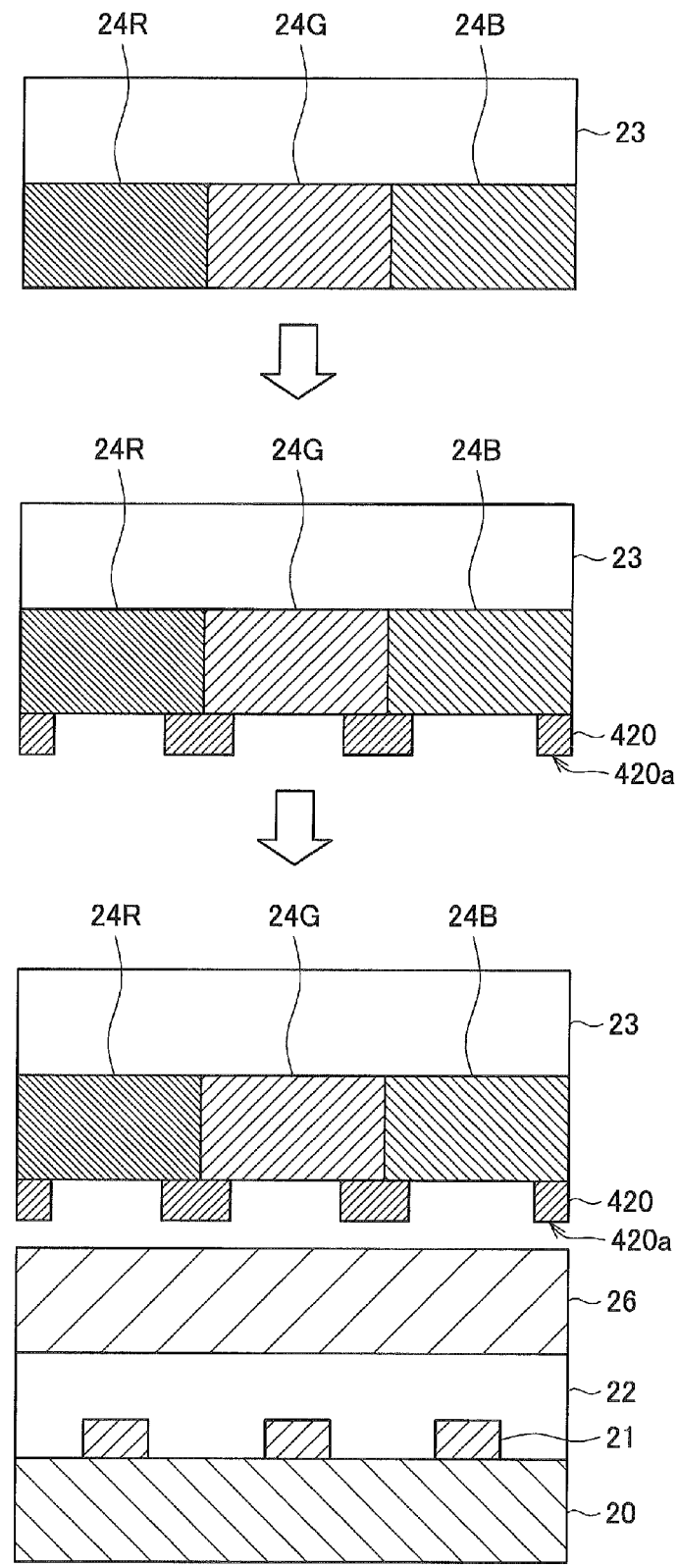
FIG. 13 illustrates states of a display device in steps of a method for manufacturing the display device according to the fourth embodiment of the present disclosure.

FIG. 13 illustrates states of the display device in steps of a method for manufacturing the display device according to the fourth embodiment of the present disclosure. Referring to FIG. 13, first, the color filters 24 having the respective colors are formed over the sealing substrate 23. The color filters 24 may be formed by, for example, patterning using photolithography or an inkjet method.

Next, the black matrixes 420 are formed over the color filters 24, and the anti-reflection structures 420a are formed by processing the surfaces of the black matrixes 420. The black matrixes 420 can be formed by, for example, applying a material over the color filters 24, and patterning the material using photolithography. In a case of the moth eye structure for example, the anti-reflection structures 420a are formed by processing the surfaces of the black matrixes 420 by a dry etching method, a nano-imprinting method, or the like. The anti-reflection structures 420a may be formed before patterning of the black matrixes 420 into the illustrated shapes, or may be formed after patterning of the black matrixes 420.

At this time, in a case where there is concern for damage to the color filters 24 through the step for forming the black matrixes 420, a protective layer that is not illustrated may be formed over the surfaces of the color filters 24, and then the black matrixes 420 may be formed thereover. Further, the color filters 24 having the respective colors might be formed with different thicknesses because of spectral characteristics, and a step can also be generated at boundary portions through the formation step. Also in a case where the step at boundary portions between the color filters 24 is large, the protective layer that is not illustrated may be formed over the surfaces of the color filters 24 and a surface of the protective layer is smoothed by chemical mechanical polishing (CMP) for example, and then the black matrixes 420 may be formed. Alternatively, at a time when the material for the black matrixes 420 is applied over the surfaces having the step, the surfaces may be smoothed by CMP for example.

Meanwhile, the light emitting elements 21 and the protective layer 22 are formed over the element substrate 20 in a different process, and the two substrates (including the members formed thereover) are bonded to each other with the adhesive layer 26 interposed therebetween. After that, by curing the adhesive layer 26, the organic EL display 400 is completed. Note that although the adhesive layer 26 is applied on the element substrate 20 side in the illustrated example, the adhesive layer 26 may be applied on the sealing substrate 23 side.

6. Moth Eye Structure

Next, examples of a method for manufacturing a moth eye structure that can be applied to each embodiment of the present disclosure will be described. Although manufacturing methods employing a dry etching method will be described below, the manufacturing methods that can be applied to the embodiments of the present disclosure are not limited thereto. Further, although a resin film is used as a material for the moth eye structure in the following description, materials used in the embodiments of the present disclosure are not limited thereto, and it is also possible to use a given material that is capable of micromachining, such as silicon dioxide or a metal material such as aluminum.

First Example

Figure 14A:
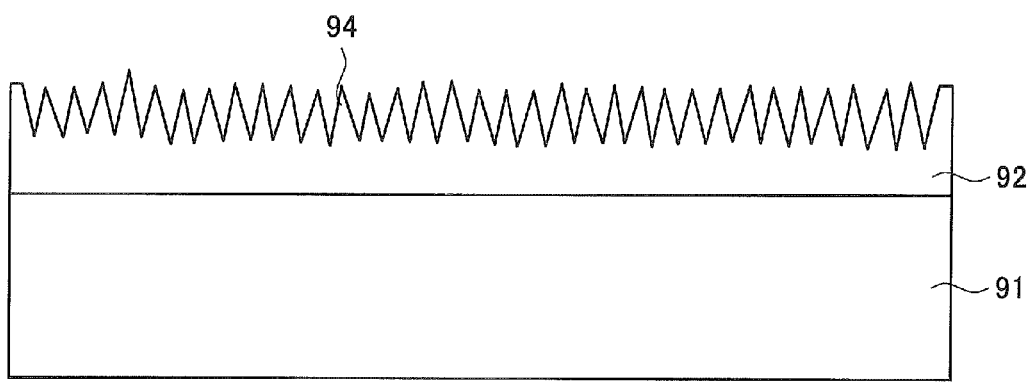
FIG. 14A illustrates a first example of a method for manufacturing a moth eye structure.

As illustrated in FIG. 14A, a resin film 92 is etched by using the micro particles (not illustrated) in the resin film 92 as a mask, and also the micro particles are gradually etched, so that a micro protrusion dummy pattern 94 is formed on the resin film 92.

Figure 14B:
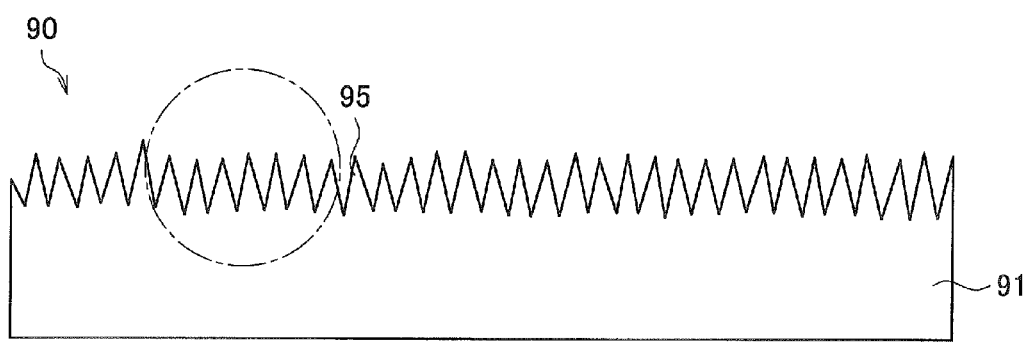
FIG. 14B illustrates the first example of the method for manufacturing the moth eye structure.

Then, as illustrated in FIG. 14B, the resin film 92 on which the micro protrusion dummy pattern 94 is formed and a surface of a process target body 91 are etched back. As a result, surface shapes of the micro protrusion dummy pattern 94 formed on a surface of the resin film 92 are transferred to the surface of the process target body 91, so that a micro protrusion pattern 95 is formed on the surface of the process target body 91.

Second Example

Figure 15A:
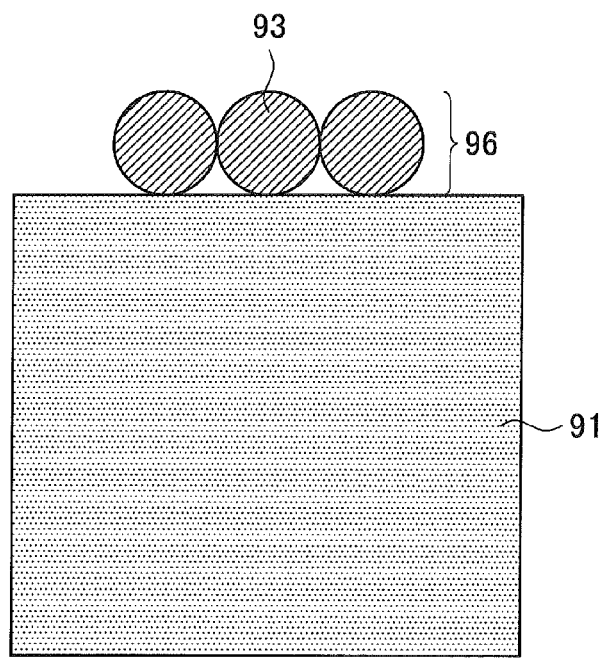
FIG. 15A illustrates a second example of a method for manufacturing a moth eye structure.

As illustrated in FIG. 15A, micro particles 93 are arranged on the surface of the process target body 91. For example, a solvent (not illustrated) in which the micro particles 93 are dispersed is formed in a film from on the surface of the process target body 91, so that the micro particles 93 are arranged on the surface of the process target body 91. Specifically, the solvent (not illustrated) in which the micro particles 93 are dispersed is applied in a film form on the surface of the process target body 91 by a coating method, and then the solvent is evaporated, so that only the micro particles 93 are arranged on the surface of the process target body 91.

Examples of a specific film formation method include dry solidification, electrophoresis absorption film, air-liquid interface mono-particle film, spin coating, photo coupling method, and other liquid thin-film methods.

For example, a silicon nitride film used as a passivation film of a solid state imaging device is used as the process target body 91, and silicon oxide particles (silica particles) are used as the micro particles 93 serving as a mask. As the solvent, a coating solution is prepared using an aqueous solution (concentration: 0.1 to 90 wt %) of water and silica particles having a particle size of about 900 nm. The coating solution is applied on the process target body 91 of the silicon nitride film which has been formed on the uppermost surface of a silicon substrate (not illustrated) by a spin coater for example. The particle size of the silica particles is not necessarily controlled strictly. It is acceptable as long as the particle size is smaller than about 300 nm and can be stably processed, that is, larger than or equal to about 90 nm, according to the wavelength of light that is to be prevented from reflecting. Further, a coating device is not limited to the spin coater, and a nozzle spray coating device may be used to perform application. After that, the solvent is evaporated by drying through baking or the like, so that a mono-particle layer 96 (a state in which the silica particles are arranged in a single layer) is obtained.

Figure 15B:
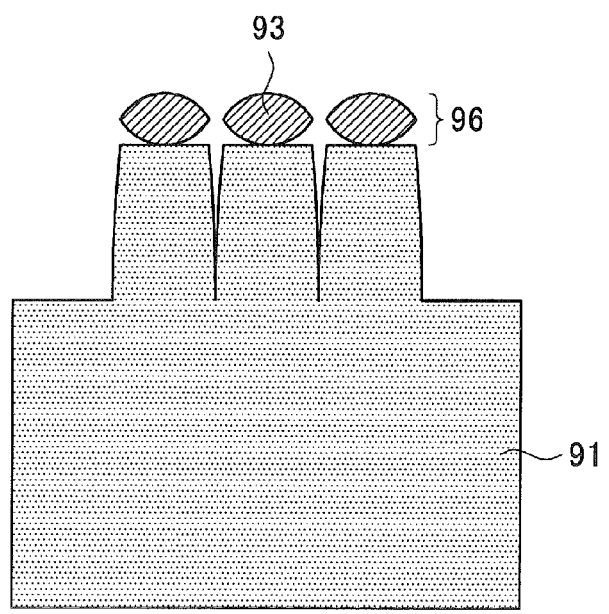
FIG. 15B illustrates the second example of the method for manufacturing the moth eye structure.
Figure 15C:
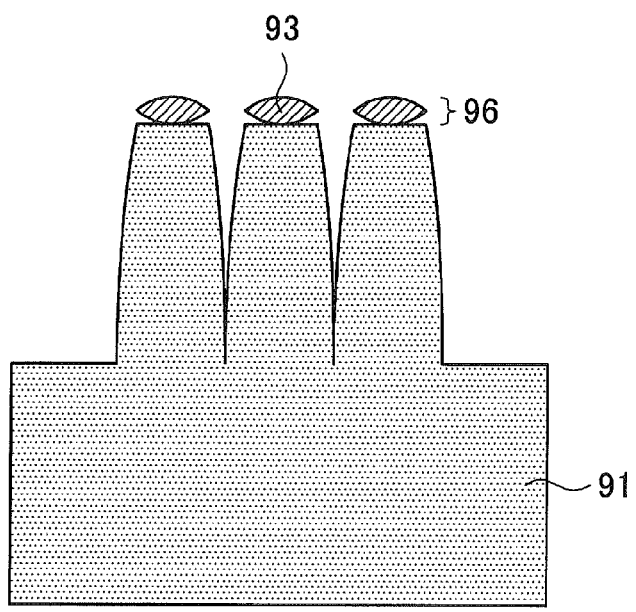
FIG. 15C illustrates the second example of the method for manufacturing the moth eye structure.
Figure 15D:
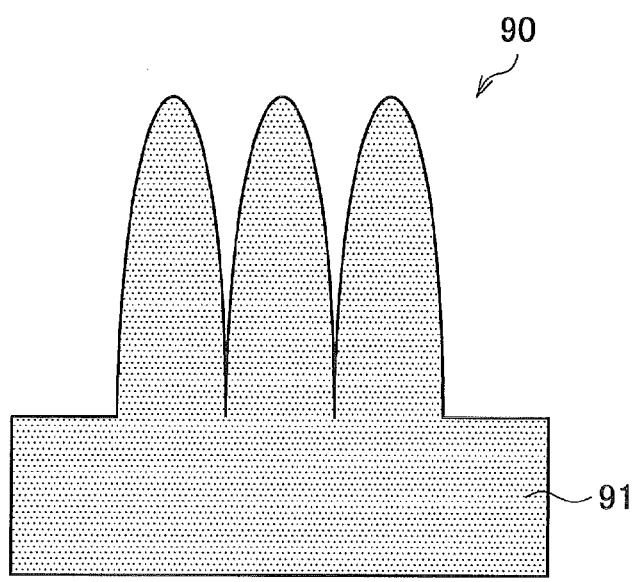
FIG. 15D illustrates the second example of the method for manufacturing the moth eye structure.

Subsequently, as illustrated in FIGS. 15B to 15D, anisotropic etching processing in which an etching rate for the process target body 91 is higher than an etching rate for the micro particles 93 is performed, so that the micro protrusion pattern 95 is formed on the surface of the process target body 91. In the anisotropic etching, the etching selectivity between the process target body 91 and the micro particles 93 is set to be constant.

Specifically, the anisotropic etching processing is performed on the process target body 91, on which the mono-particle layer 96 is formed, by using a parallel-plate plasma etching device for example. As an etching gas of the anisotropic etching, carbon tetrafluoride ($CF_4$), argon (Ar), and oxygen ($O_2$) are used. For example, the flow rates of $CF_4$, Ar, $O_2$ are set to 90 cm$^3$/min, 900 cm$^3$/min, and 6 cm$^3$/min, respectively. Further, an atmospheric pressure (internal pressure of a chamber) of the etching is set to 0.67 Pa, a source power to 9000 W, a bias power to 500 W, and a substrate temperature to 20° C. These conditions are examples and can be changed as appropriate.

In the etching conditions, the etching selectivity between the silica particles and the silicon nitride film is 3. That is, the silica particles and the silicon nitride film are etched in a ratio of 1:3 per unit area.

FIG. 15B illustrates a state where the micro particles 93 (silica particles) are etched to ½ of a thickness thereof under the above-described conditions. FIG. 15C illustrates a state where the micro particles 93 (silica particles) are etched to ¾ of a thickness thereof. Further, FIG. 15D illustrates a state where the micro particles 93 (silica particles) are completely etched. Through the etching step, the spindle-shaped micro protrusion pattern 95 which is about 900 nm in width and about 300 nm in height can be formed on the surface of the process target body 91. In this manner, a moth eye structure body 90 is formed from a cluster of the micro protrusion pattern 95 formed on the entire surface of the process target body 91.

Since the higher the micro protrusion pattern 95, the smoother a refractive index variation becomes, it is desirable for the moth eye structure body. Note that since the thicker the moth eye structure body 90, the greater the amount of light to be absorbed becomes, the height of the micro protrusion pattern 95 may be set considering the reflection and the absorption.

Although the etching selectivity is adjusted so that an aspect ratio (the ratio of height to width direction) is 3 in this example, the width and height dimensions of the micro protrusion pattern 95 may be set according to the performance expected for the device, and accordingly, conditions for the micro particles 93 and the etching may be set.

Even when a film using another material having a different refractive index from the silicon nitride film is formed on an upper portion of the thus obtained micro protrusion pattern 95 formed on the surface of the process target body 91 formed of the silicon nitride film, reflection is very difficult to occur. It is needless to say that even when the air is on the upper portion of the micro protrusion pattern 95 instead of a film using another material, reflection is very difficult to occur in a similar manner.

Note that the micro particles 93 that can be used are not limited to the silicon oxide particles (silica particles). Examples of inorganic particles include particles made from compounds of oxides, nitrides, carbides, borides, sulfides, and the like, and metallic particles. Examples of the oxides include silicon oxide (silica), aluminum oxide (alumina), zirconium oxide (zirconia), titanium oxide (titania), cerium oxide (ceria), zinc oxide, and tin oxide. Examples of the nitrides include silicon nitride, aluminum nitride, and boron nitride. Examples of the carbides include silicon carbide, boron carbide, diamond, graphite, and fullerenes. Examples of the borides include zirconium boride ($ZrB_2$) and chromium boride ($CrB_2$). Examples of the metallic particles include gold, silver, platinum, palladium, copper, nickel, cobalt, and iron. More suitably, however, micro particles made from a material that does not contain a metal element that causes contaminations are desirably used. Therefore, silicon, silica, diamond, silicon nitride, and silicon carbide (SiC) are suitably used.

Examples of an organic material include a styrene-based resin such as polystyrene, an acryl-based resin such as polymethylmethacrylate, a polymer obtained by coordination polymerization, such as polyethylene or polyproplylene, a polymer obtained by condensation polymerization, such as polycarbonate, polyamide (for example, Nylon 66 (Registered Trademark)), polyester, polyimide, polyphenylene ether, polyarylene sulfide, polyetherketone, or polyetheretherketone, a polymer obtained by ring-opening polymerization, such as Nylon 6 (Registered Trademark) or polycaprolactone, and an organic crystal such as pigment.

Although polyhedral shapes, spherical shapes, and the like can be suitably used as the shape of the micro particles 93, spherical shapes are particularly preferably used because it is easy to control arrangement and to obtain a closest packed structure. The size of particles can be selected as appropriate according to a desired moth eye structure; however, it is preferable that the average particle size is greater than or equal to 90 nm and less than or equal to 300 nm. Although there are no particular limitations on a particle size distribution of the micro particles 93, in order to form a mono-particle layer easily, it is more preferable to use particles having a sharp particle size distribution, particularly having a monodisperse distribution, than to use particles having a great particle size distribution.

The process target body 91 can be formed using any of a variety of materials, examples of which include a silicon substrate, a single-crystalline silicon film, a poly-crystalline silicon film, an amorphous silicon film, a silicon oxide film, a silicon nitride film, a silicon oxynitride film, a resin film, a tungsten film, an aluminum film, a copper (Cu) film, glass, quartz, and a resin board. The material for the micro particles 93 may be selected so as to comply with etching conditions suitable for the process target body 91, and etching conditions may be adjusted so that the etching selectivity can comply with the formation of the above-described moth eye structure.

According to the method for manufacturing the moth eye structure body 90 according to the second example described above, anisotropic etching processing in which the etching rate for the process target body 91 is higher than the etching rate for the micro particles 93 is performed in a state where the micro particles 93 are arranged on the surface of the process target body 91. As a result, the surface of the process target body 91 can be etched by using the micro particles 93 as an etching mask. Further, since the micro particles 93 are etched at a lower etching rate than the process target body 91, the micro protrusion pattern 95 is formed into a shape such that a volume of each protrusions increases in an approximately linear fashion from the apex to the bottom of each protrusion when the protrusion is divided into equal thicknesses in a height direction thereof.

Further, since the micro particles 93 have spherical shapes, when the surface of the process target body 91 is etched while the micro particles 93 are etched, the spindle-shaped micro protrusion pattern 95 is formed on the surface of the process target body 91. Therefore, the use of the spherical or substantially spherical micro particles enables the formation of a microscopic two-dimensional pattern that is expected for the moth eye structure without using any expensive lithography means.

Furthermore, by dispersing the micro particles 93 in a solvent, it is possible to distribute the micro particles 93 uniformly. Therefore, the micro particles 93 formed on the surface of the process target body 91, the micro particles 93 being dispersed in the solvent, are arranged on the surface of the process target body 91 in a uniform distribution. Furthermore, when the solvent has a velocity of about 0.01 Pa·s or more for example, it is also possible to arrange the micro particles 93 on a curved surface.

Third Example

Figure 16A:
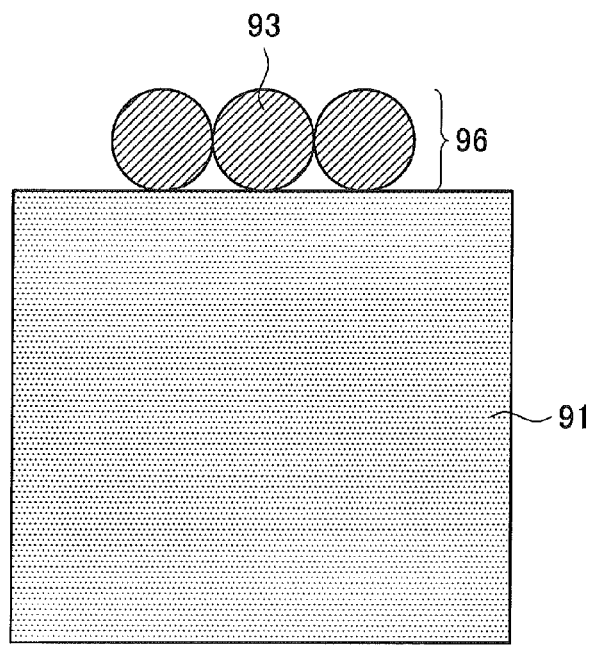
FIG. 16A illustrates a third example of a method for manufacturing a moth eye structure.

As illustrated in FIG. 16A, the micro particles 93 are arranged on the surface of the process target body 91 in the same manner as the above-described second example. For example, a solvent (not illustrated) in which the micro particles 93 are dispersed is formed in a film from on the surface of the process target body 91, so that the micro particles 93 are arranged on the surface of the process target body 91. Specifically, the solvent (not illustrated) in which the micro particles 93 are dispersed is applied in a film form on the surface of the process target body 91 by a coating method, and then the solvent is evaporated, so that only the micro particles 93 are arranged on the surface of the process target body 91.

Examples of a specific film formation method include dry solidification, electrophoresis absorption film, air-liquid interface mono-particle film, spin coating, photo coupling method, and other liquid thin-film methods.

For example, a silicon nitride film used as a passivation film of a solid state imaging device is used as the process target body 91, and silicon oxide particles (silica particles) are used as the micro particles 93 serving as a mask. As the solvent, a coating solution is prepared using an aqueous solution (concentration: 0.1 to 90 wt %) of water and silica particles having a particle size of about 900 nm. The coating solution is applied on the process target body 91 of the silicon nitride film which has been formed on the uppermost surface of a silicon substrate (not illustrated) by a spin coater for example. The particle size of the silica particles is not necessarily controlled strictly. It is acceptable as long as the particle size is smaller than about 300 nm and can be stably processed, that is, larger than or equal to about 90 nm, according to the wavelength of light that is to be prevented from reflecting. Further, a coating device is not limited to the spin coater, and a nozzle spray coating device may be used to perform application. After that, the solvent is evaporated by drying through baking or the like, so that the mono-particle layer 96 (a state in which the silica particles are arranged in a single layer) is obtained.

Figure 16B:
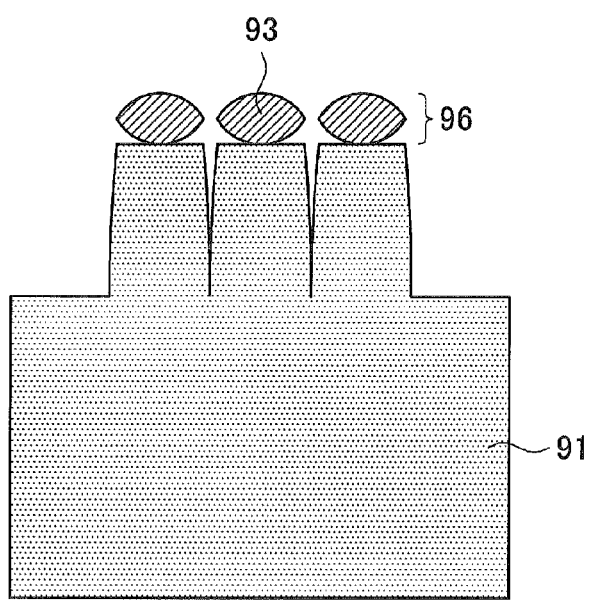
FIG. 16B illustrates the third example of the method for manufacturing the moth eye structure.
Figure 16C:
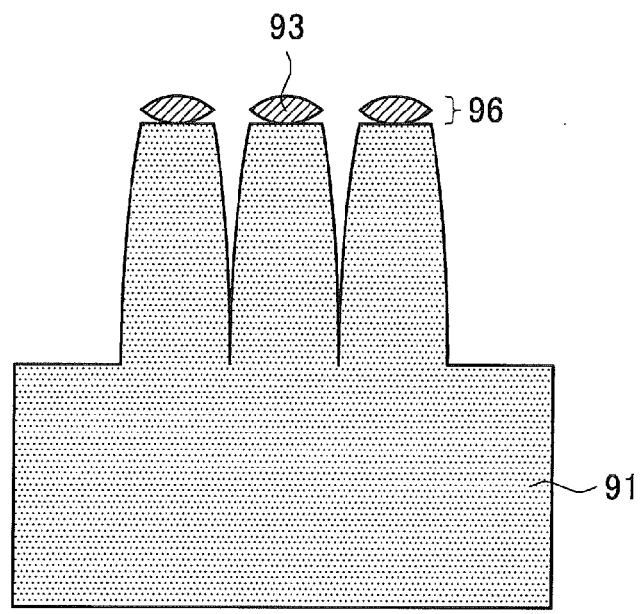
FIG. 16C illustrates the third example of the method for manufacturing the moth eye structure.
Figure 16D:
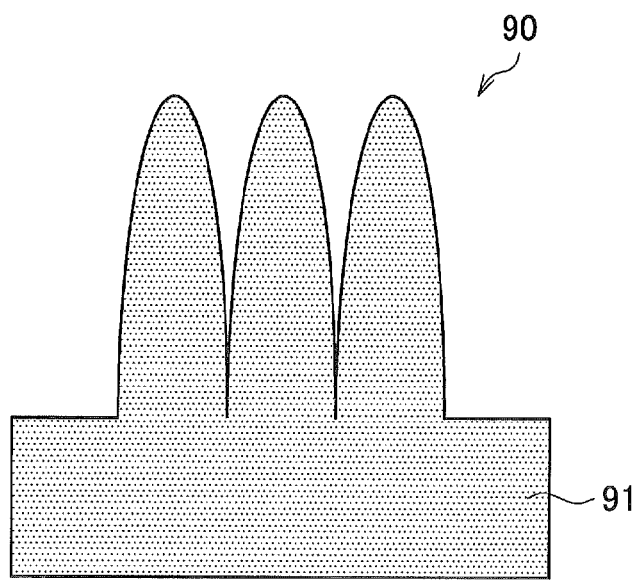
FIG. 16D illustrates the third example of the method for manufacturing the moth eye structure.

Subsequently, as illustrated in FIGS. 16B to 16D, anisotropic etching processing in which an etching rate for the process target body 91 is higher than an etching rate for the micro particles 93 is performed, so that the micro protrusion pattern 95 is formed on the surface of the process target body 91. In the anisotropic etching, a relationship of the etching selectivity between the process target body 91 and the micro particles 93 is varied during the etching, and the etching rate for the process target body 91 is higher than the etching rate for the micro particles 93. Accordingly, the volume change in the height direction of the micro protrusion pattern 95 is made approximately linear.

Specifically, the anisotropic etching processing is performed on the process target body 91, on which the mono-particle layer 96 is formed, by using a parallel-plate plasma etching device for example. As an etching gas of the anisotropic etching, carbon tetrafluoride ($CF_4$), argon (Ar), and oxygen ($O_2$) are used. For example, the flow rates of $CF_4$, Ar, $O_2$ are first set to 4 $cm^3$/min, 900 $cm^3$/min, and 6 $cm^3$/min, respectively. Further, an atmospheric pressure (internal pressure of a chamber) of the etching is set to 0.67 Pa, a source power to 9000 W, a bias power to 500 W, and a substrate temperature to 20° C. These conditions are examples and can be changed as appropriate.

FIG. 16B illustrates a state where the micro particles 93 (silica particles) are etched to ½ of a thickness thereof under the above-described conditions.

Subsequently, until when 70% of the micro particles 93 (silica particles) are etched, the flow rate of oxygen ($O_2$) is set to 6 $cm^3$/min and the etching selectivity is set to 3. FIG. 16C illustrates a state where the micro particles 93 (silica particles) are etched to 70% of a thickness thereof.

Subsequently, until when 90% of the thickness of the micro particles 93 (silica particles) is etched, the flow rate of oxygen ($O_2$) is set to 8 $cm^3$/min and the etching selectivity is set to 4. Further, until when the micro particles 93 (silica particles) are completely etched, the flow rate of oxygen ($O_2$) is set to 90 $cm^3$/min and the etching selectivity is set to 5. FIG. 16D illustrates a state where the micro particles 93 (silica particles) are completely etched.

Through these steps, the spindle-shaped micro protrusion pattern 95 which is about 900 nm in width and about 300 nm in height can be formed on the surface of the process target body 91. In this manner, the moth eye structure body 90 is formed from a cluster of the micro protrusion pattern 95 formed on the entire surface of the process target body 91.

Since the higher the micro protrusion pattern 95, the smoother a refractive index variation becomes, it is desirable for the moth eye structure. Note that since the thicker the moth eye structure, the greater the amount of light to be absorbed becomes, the height of the micro protrusion pattern 95 may be set considering the reflection and the absorption.

Although the etching selectivity between the micro particles 93 (silica particles) and the process target body 91 (silicon nitride film) is changed by changing the flow rates of oxygen ($O_2$) in the above-described example, the etching selectivity can also be similarly controlled by changing the chamber pressure. Although the etching rate for the micro particles 93 (silica particles) is not changed very much even when the chamber pressure is changed, the etching rate for the silicon nitride film is changed. For example, in a case where the chamber pressure is changed from 0.27 Pa to 93.3 Pa, the etching rate for the silicon nitride film can be increased by about three times. Therefore, the etching conditions are set such that the initial etching selectivity is set to 2 (the micro particles 93 (silica particles) and the silicon nitride film are etched in a ratio of 1:2 per unit area). Further, as described above, by increasing the chamber pressure such that the final etching selectivity becomes 5, a suitable moth eye structure can be similarly formed.

According to the method for manufacturing the moth eye structure body 90 according to the third example described above, the anisotropic etching processing in which the etching rate for the process target body 91 is higher than the etching rate for the micro particles 93 is performed in a state where the micro particles 93 are arranged on the surface of the process target body 91. As a result, the surface of the process target body 91 can be etched by using the micro particles 93 as an etching mask. Further, in the anisotropic etching, the relationship of the etching selectivity between the process target body 91 and the micro particles 93 is varied during the etching, and the etching rate for the process target body 91 is made higher than the etching rate for the micro particles 93. Accordingly, the volume change in the height direction of the micro protrusion pattern 95 is made approximately linear. Therefore, the refractive index changes in a linear fashion in the height direction of the micro protrusion pattern 95 in the moth eye structure body 90. That is, the refractive index decreases in a linear fashion from the base to the apex of the micro protrusion pattern 95.

Furthermore, the spherical shapes of the micro particles 93 cause the volume change in the height direction of the micro protrusion pattern 95 to become approximately linear easily. That is, since the micro particles 93 are downsized while being etched, the surface of the process target body 91 is etched into a spindle shape, so that the micro protrusion pattern 95 is formed. For example, when the micro particles 93 have a planar shape, the thickness of the micro particles 93 is thinned by the progress of etching, but the size thereof hardly changes. In that case, the process target body 91 is formed into a columnar shape to which the planar shape of the micro particles 93 is transferred, not into the spindle shape.

Furthermore, by dispersing the micro particles 93 in a solvent, it is possible to distribute the micro particles 93 uniformly. Therefore, the micro particles 93 formed on the surface of the process target body 91, the micro particles 93 being dispersed in the solvent, are arranged on the surface of the process target body 91 in a uniform distribution. Furthermore, the use of the spherical or substantially spherical micro particles enables the formation of a microscopic two-dimensional pattern that is expected for the moth eye structure without using any expensive lithography means.

A method for setting etching conditions such that the etching selectivity increases with the progress of etching, in the same manner as the third example described above, can be applied to the etching according to the above-described first example in which the micro protrusion dummy pattern 14 is formed. In this case, it is possible to form the micro protrusion dummy pattern 14 into a spindle shape.

7. Supplement

Although the examples in which the display device is the organic EL display are shown in the above description of the embodiments, the embodiments of the present disclosure are not limited to those examples. Each embodiment of the present disclosure can be applied to any of a variety of display devices such as an inorganic EL display as long as the display device includes a light emitting element.

Although preferred embodiments of the present disclosure are described in detail with reference to the accompanying drawings, the technical scope of the present disclosure is not limited thereto. It should be understood by those skilled in the art that various modifications, combinations, sub-combinations and alterations may occur depending on design requirements and other factors insofar as they are within the scope of the appended claims or the equivalents thereof.

Additionally, the present application may also be configured as below.

(1) A display device including:
 a plurality of light emitting elements over a first substrate; and
 an anti-reflection member configured to prevent reflection of light from a first substrate side at a boundary portion in a pixel region corresponding to each of the light emitting elements, the anti-reflection member being on a second substrate side where a second substrate faces the first substrate.

(2) The display device according to (1), further including:
 a color filter provided in the pixel region over the second substrate,
 wherein the anti-reflection member is provided between the color filter and a surface of the second substrate.

(3) The display device according to (2), wherein an anti-reflection target wavelength with the anti-reflection member is set according to a wavelength of light that is transmitted through the color filter provided in pixel regions on both sides of the anti-reflection member.

(4) The display device according to (1), further including:
 a color filter provided in the pixel region over the second substrate,
 wherein the anti-reflection member is provided over a surface of the color filter on the first substrate side.

(5) The display device according to (4), wherein an anti-reflection target wavelength with the anti-reflection member is set according to a wavelength of light emitted from the light emitting elements corresponding to pixel regions on both sides of the anti-reflection member.

(6) The display device according to any one of (1) to (5), further including:
 a black matrix provided at the boundary portion in the pixel region,
 wherein the anti-reflection member is provided along a surface of the black matrix on the first substrate side.

(7) The display device according to (6), wherein the anti-reflection member is anti-reflection coating.

(8) The display device according to any one of (1) to (5), further including:
 a black matrix provided at the boundary portion in the pixel region, the black matrix being configured to function also as the anti-reflection member by being subjected to processing of a surface of the black matrix on the first substrate side.

(9) The display device according to any one of (1) to (6) and (8), wherein a moth eye structure is formed on a surface of the anti-reflection member on the first substrate side.

(10) A method for manufacturing a display device, the method including:

providing an anti-reflection member on a second substrate side where a second substrate faces a first substrate, the anti-reflection member being configured to prevent reflection of light from a first substrate side at a boundary portion in a pixel region corresponding to each of a plurality of light emitting elements over the first substrate; and bonding the second substrate to the first substrate over which the plurality of light emitting elements are provided.

(11) The method for manufacturing a display device according to (10), the method further including:

providing a color filter in the pixel region over the second substrate, wherein the step of providing the anti-reflection member is executed before the step of providing the color filter.

(12) The method for manufacturing the display device according to (10), the method further including:

providing a color filter in the pixel region over the second substrate, wherein the step of providing the anti-reflection member is executed after the step of providing the color filter.

(13) The method for manufacturing a display device according to any one of (10) to (12), the method further including:

providing a black matrix at the boundary portion in the pixel region, wherein the anti-reflection member is provided along a surface of the black matrix on the first substrate side.

(14) The method for manufacturing a display device according to any one of (10) to (12), wherein the step of providing the anti-reflection member include providing a black matrix at the boundary portion in the pixel region, and forming an anti-reflection structure by processing a surface of the black matrix on the first substrate side.

(15) The method for manufacturing a display device according to (10), the method further including:

forming a moth eye structure on a surface of the anti-reflection member on the first substrate side.

(16) The method for manufacturing a display device according to (15), wherein the step of forming the moth eye structure includes forming, on the surface of the anti-reflection member, a resin film in which micro particles are dispersed, forming a micro protrusion dummy pattern on the resin film by etching the resin film by using the micro particles in the resin film as a mask and gradually etching the micro particles, and forming a micro protrusion pattern on the surface of the anti-reflection member by etching back the resin film on which the micro protrusion dummy pattern is formed and the surface of the anti-reflection member to transfer, to the surface of the anti-reflection member, a surface shape of the micro protrusion dummy pattern formed on the surface of the resin film.

(17) The method for manufacturing a display device according to (15), wherein the step of forming the moth eye structure includes arranging micro particles on a surface of the anti-reflection member, and forming a micro protrusion pattern on the surface of the anti-reflection member by performing anisotropic etching processing in which an etching rate for the anti-reflection member is higher than an etching rate for the micro particles.

(18) An electronic device including:

a display device including a plurality of light emitting elements provided over a first substrate, and an anti-reflection member configured to prevent reflection of light from a first substrate side at a boundary portion in a pixel region corresponding to each of the light emitting elements, the anti-reflection member being on a second substrate side where a second substrate faces the first substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
a plurality of light emitting elements provided on a first substrate;
a second substrate facing the first substrate;
an anti-reflection member positioned at the second substrate at a boundary portion in a pixel region corresponding to the plurality of light emitting elements;
a black matrix provided at the boundary portion: and
a color filter layer provided in the pixel region at the second substrate,
wherein the anti-reflection member is configured to prevent reflection of light from at least one of the plurality of light emitting elements, and the anti-reflection member is provided at a surface of the black matrix in a same area as the black matrix, and
wherein the anti-reflection member is provided in the color filter layer.

2. The display device according to claim 1, wherein the anti-reflection member is positioned at an edge portion between a first color filter and a second color filter, and wherein an anti-reflection target wavelength of the anti-reflection member is associated with a color wavelength of at least one of the first color filter and the second color filter.

3. The display device according to claim 2, wherein the anti-reflection target wavelength is based on a color wavelength of the first color filter if the color wavelength of the first color filter is longer than the second color filter.

4. The display device according to claim 1, wherein the anti-reflection member includes an anti-reflection coating.

5. The display device according to claim 1, wherein a moth eye structure is formed on a surface of the anti-reflection member.

6. The display device according to claim 1, wherein the display includes an organic EL display.

7. The display device according to claim 1, wherein the anti-reflection member includes at least one selected from the group consisting of a cyclo olefin polymer, an ultraviolet ray curable resin, and silicon dioxide.

8. The display device according to claim 1, wherein the boundary portion is between adjacent light emitting elements of the display device.

9. An electronic device comprising:
a display device including
a plurality of light emitting elements provided on a first substrate;
a second substrate facing the first substrate;

an anti-reflection member positioned at the second substrate at a boundary portion in a pixel region corresponding to the plurality of light emitting elements;
a black matrix provided at the boundary portion; and
a color filter layer provided in the pixel region at the second substrate,
wherein the anti-reflection member is configured to prevent reflection of light from at least one of the plurality of light emitting elements, and the anti-reflection member is provided at a surface of the black matrix in a same area as the black matrix, and
wherein the anti-reflection member is provided in the color filter layer.

10. The electronic device according to claim 9, wherein the anti-reflection member is positioned at an edge portion between a first color filter and a second color filter, and wherein an anti-reflection target wavelength of the anti-reflection member is associated with a color wavelength of the first color filter and the second color filter.

11. The electronic device according to claim 10, wherein the anti-reflection target wavelength is based on a color wavelength of the first color filter if the color wavelength of the first color filter is longer than the second color filter.

12. The electronic device according to claim 9, wherein the anti-reflection member includes an anti-reflection coating.

13. The electronic device according to claim 9, wherein a moth eye structure is formed on a surface of the anti-reflection member.

14. The electronic device according to claim 9, wherein the display includes an organic EL display.

15. The electronic device according to claim 9, wherein the boundary portion is between adjacent light emitting elements of the display device.

* * * * *